United States Patent
Iwayama

(10) Patent No.: US 9,276,039 B2
(45) Date of Patent: Mar. 1, 2016

(54) SEMICONDUCTOR STORAGE DEVICE AND METHOD OF MANUFACTURING THE SAME

(75) Inventor: Masayoshi Iwayama, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/124,647

(22) PCT Filed: Mar. 1, 2012

(86) PCT No.: PCT/JP2012/055167
§ 371 (c)(1),
(2), (4) Date: Dec. 6, 2013

(87) PCT Pub. No.: WO2012/169241
PCT Pub. Date: Dec. 13, 2012

(65) Prior Publication Data
US 2014/0124883 A1    May 8, 2014

(30) Foreign Application Priority Data
Jun. 9, 2011   (JP) .................. 2011-129213

(51) Int. Cl.
*H01L 29/82* (2006.01)
*H01L 27/22* (2006.01)
(Continued)

(52) U.S. Cl.
CPC .......... *H01L 27/222* (2013.01); *H01L 27/0207* (2013.01); *H01L 28/20* (2013.01); *H01L 43/08* (2013.01); *H01L 43/12* (2013.01)

(58) Field of Classification Search
CPC ....... H01L 43/08; H01L 29/82; H01L 23/528; H01L 27/222; H01L 43/065; G11C 11/16
USPC ......... 257/20, 414, 421–427, E29.323; 438/3
See application file for complete search history.

(56) References Cited

U.S. PATENT DOCUMENTS 5,695,864 A * 12/1997 Slonczewski .......... B82Y 10/00
                                                             324/252
6,590,244 B2   7/2003 Asao et al.
(Continued)

FOREIGN PATENT DOCUMENTS

EP          1085586 A2    3/2001
JP         2002-359356   12/2002
(Continued)

OTHER PUBLICATIONS

International Preliminary Report of Patentability dated Dec. 27, 2013 for PCT Application No. PCT/JP2012/055167 filed Mar. 1, 2012.
(Continued)

*Primary Examiner* — Jami M Valentine
(74) *Attorney, Agent, or Firm* — Knobbe, Martens, Olson & Bear, LLP

(57) ABSTRACT

The semiconductor storage device includes a memory cell array region in which a plurality of storing MTJ elements capable of changing resistance depending on a direction of magnetization are arranged on a semiconductor substrate. The semiconductor storage device includes a resistive element region in which a plurality of resisting MTJ elements are arranged on the semiconductor substrate along a first direction and a second direction perpendicular to the first direction. An area of a first cross section of the resisting MTJ element parallel with an upper surface of the semiconductor substrate is larger than an area of a second cross section of the storing MTJ element parallel with the upper surface of the semiconductor substrate.

10 Claims, 21 Drawing Sheets

(51) Int. Cl.
  *H01L 49/02* (2006.01)
  *H01L 43/08* (2006.01)
  *H01L 43/12* (2006.01)
  *H01L 27/02* (2006.01)

(56) References Cited

U.S. PATENT DOCUMENTS

| | | | |
|---|---|---|---|
| 6,754,098 B2 | 6/2004 | Kunikiyo | |
| 7,141,842 B2 | 11/2006 | Kajiyama | |
| 7,463,509 B2 * | 12/2008 | Kim et al. | 365/158 |
| 2002/0140060 A1 * | 10/2002 | Asao et al. | 257/661 |
| 2003/0198096 A1 | 10/2003 | Kunikiyo | |
| 2005/0070033 A1 | 3/2005 | Kajiyama | |
| 2006/0067116 A1 * | 3/2006 | Hayakawa | G11C 11/16 365/171 |
| 2012/0153414 A1 * | 6/2012 | Shuto | H01L 27/228 257/427 |
| 2014/0355330 A1 * | 12/2014 | Endoh | H03K 3/356139 365/148 |

FOREIGN PATENT DOCUMENTS

| | | |
|---|---|---|
| JP | 2003-298150 | 10/2003 |
| JP | 2003-303942 | 10/2003 |
| JP | 2005-108973 | 4/2005 |
| JP | 2005-303156 | 10/2005 |
| TW | 535277 B | 6/2003 |

OTHER PUBLICATIONS

Taiwanese Office Action dated May 9, 2014 for Taiwanese Application 101108927.
Japanese Office Action dated Oct. 29, 2013 for Japanese Application No. 2011-129213 filed Jun. 9, 2011.
International Preliminary Report of Patentability dated Dec. 27, 2013 for PCT Application No. PT/JP2012/05517 filed Mar. 1, 2012.
Japanese Office Action dated Jan. 7, 2014 for JP Application No. 2011-129213 filed Jun. 9, 2011.
International Search Report dated Apr. 3, 2012 for PCT Application No. PCT/JP2012/055167 filed Mar. 1, 2012.

* cited by examiner

SEMICONDUCTOR STORAGE DEVICE AND METHOD OF MANUFACTURING THE SAME

TECHNICAL FIELD

The present invention relates to a semiconductor storage device and a method of manufacturing the same.

BACKGROUND ART

Conventional semiconductor storage devices, such as MRAM, need to have a resistive element in the circuit design.

For example, a typical resistive element led using an active area or gate wiring of a memory cell array has a low sheet resistance, a high parasitic capacitance or bad temperature characteristics. For such reasons, the resistive element is often out of circuit design specifications.

Thus, there is a need for a newly developed resistive element that has a desired sheet resistance, temperature characteristics or the like.

This leads to an elongated development period and an increase of the manufacturing cost due to an additional process.

DISCLOSURE OF THE INVENTION

A semiconductor storage device according to an embodiment, includes a memory cell array region in which a plurality of storing MTJ elements capable of changing resistance depending on a direction of magnetization are arranged on a semiconductor substrate. The semiconductor storage device includes a resistive element region in which a plurality of resisting MTJ elements are arranged on the semiconductor substrate along a first direction and a second direction perpendicular to the first direction. An area of a first cross section of the resisting MTJ element parallel with an upper surface of the semiconductor substrate is larger than an area of a second cross section of the storing MTJ element parallel with the upper surface of the semiconductor substrate.

BRIEF DESCRIPTION OF THE DRAWINGS

In FIGS. 11 and 12, the same reference symbols as those in FIGS. 2 and 3 denote the same components as in the first embodiment.

MODE FOR CARRYING OUT THE INVENTION

In the following, embodiments will be described with reference to the drawings. In the embodiments below, as an example of a semiconductor storage device, an MRAM having an MTJ element that changes resistance depending on the direction of magnetization will be described. In the embodiments below, a case where the present invention is applied to an MTJ element of perpendicular magnetization type will be described. However, the present invention can be equally applied to an MTJ element of plane magnetization type.

First Embodiment

Figure 1:
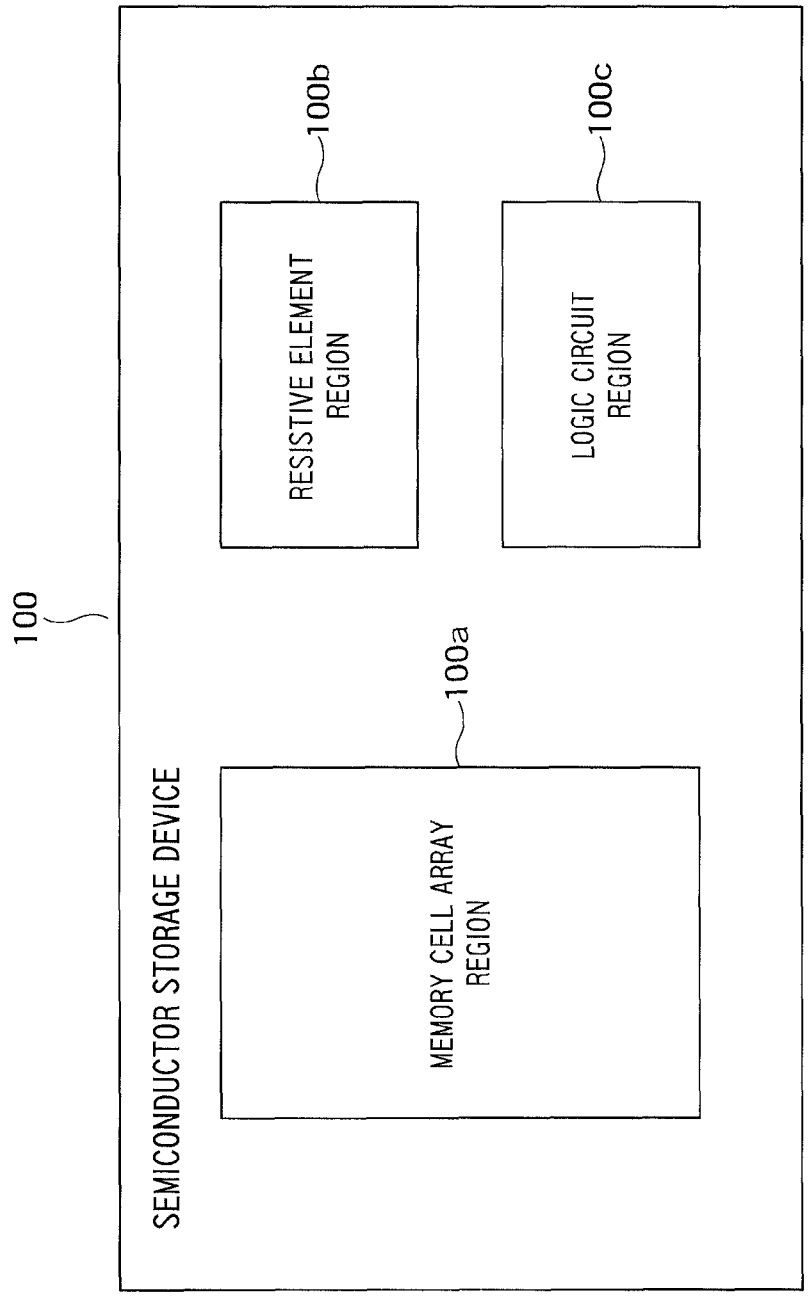
FIG. 1 is a block diagram showing a configuration of a semiconductor storage device 100 according to a first embodiment.
Figure 2:
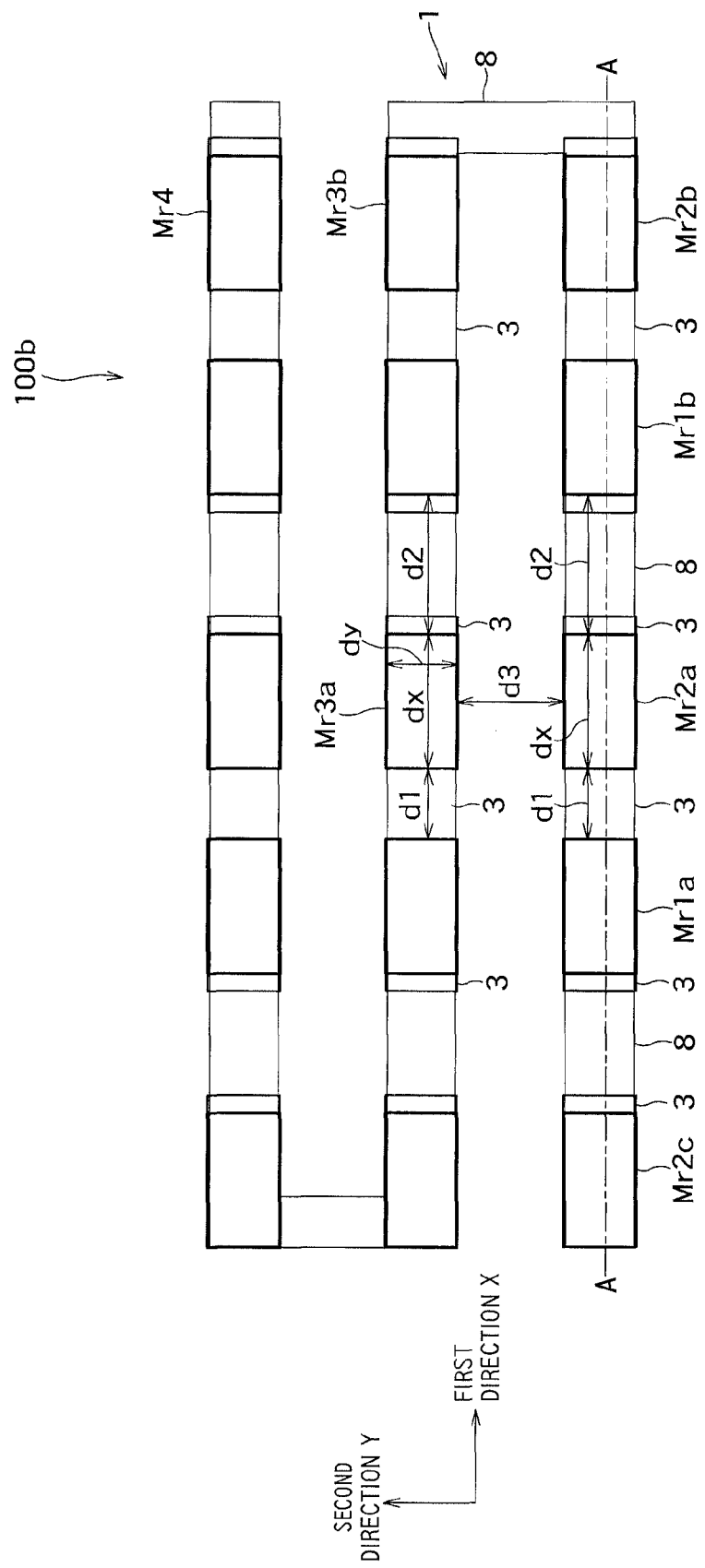
FIG. 2 is a plan view showing an example of a layout of a resistive element region 100b of the semiconductor storage device 100 shown in FIG. 1 in which resisting MTJ elements are electrically connected in series with each other.
Figure 3:
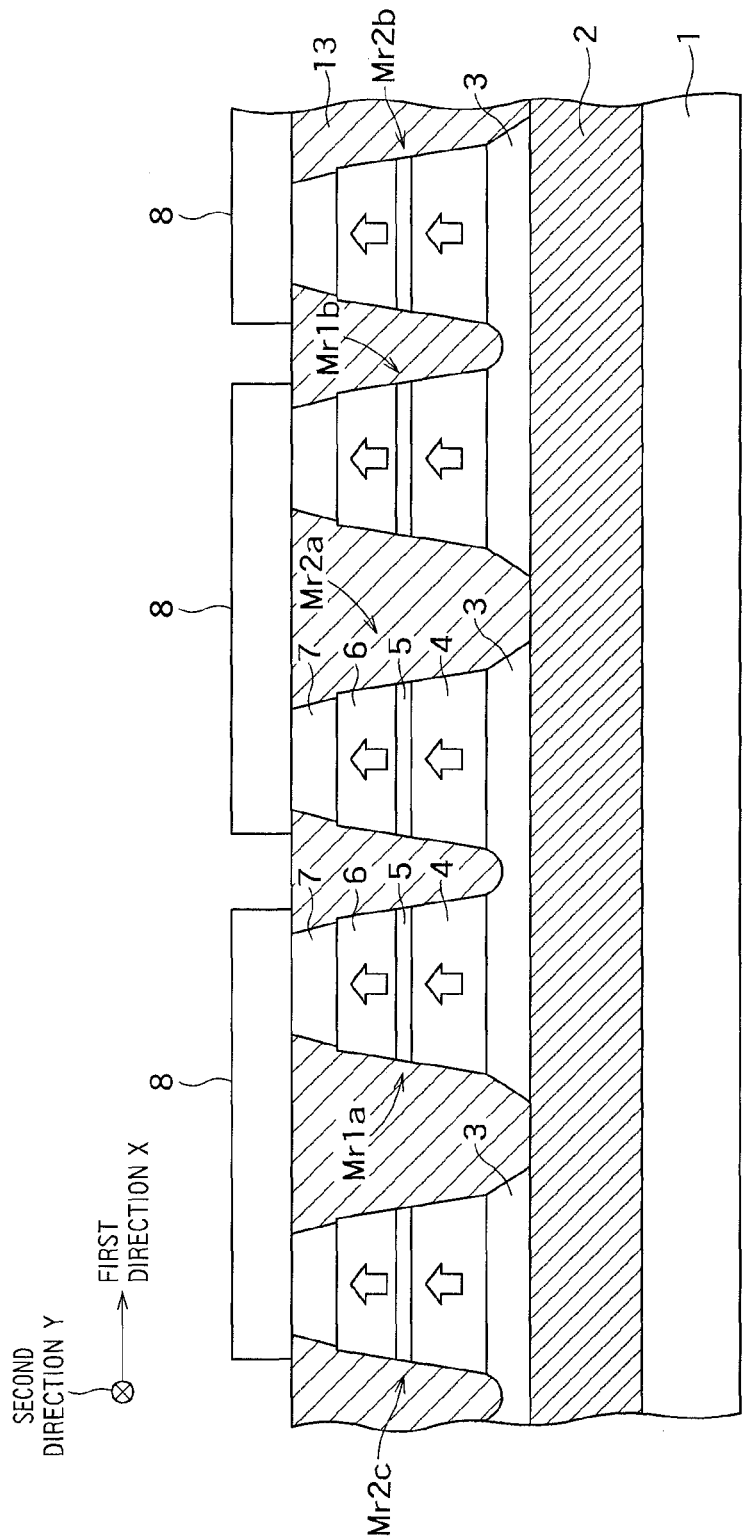
FIG. 3 is a cross-sectional view showing an example of a cross section taken along the line A-A in FIG. 2.
Figure 4:
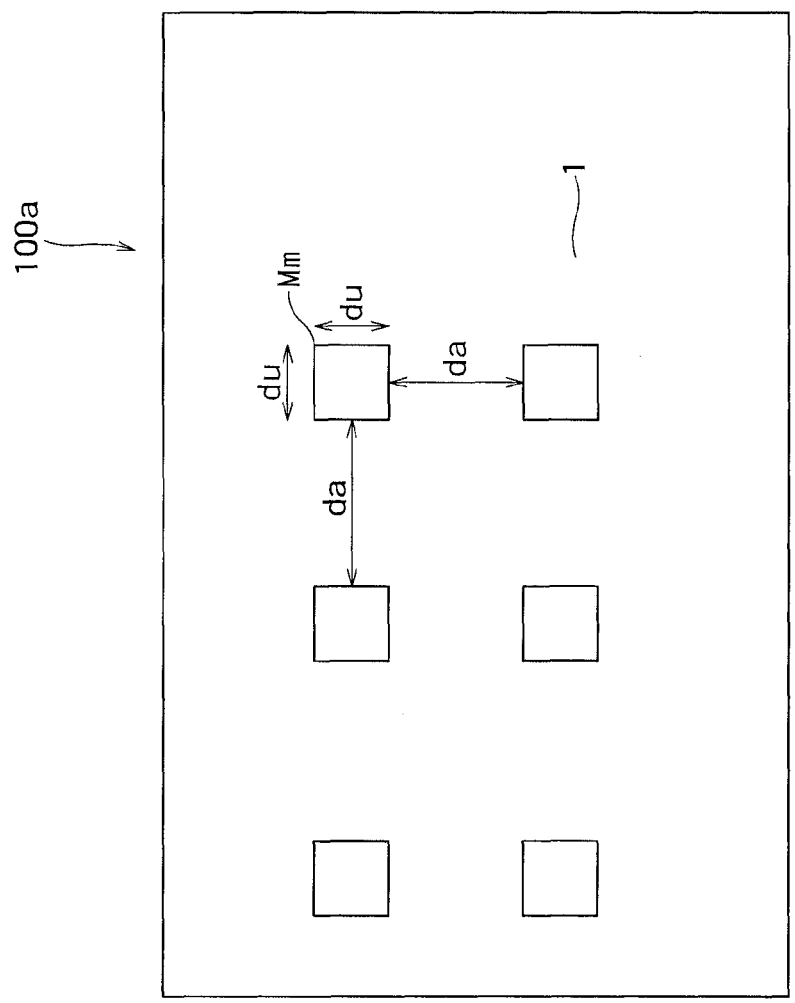
FIG. 4 is a plan view showing an example of a layout of a memory cell array region 100a of the semiconductor storage device 100 shown in FIG. 1.

FIG. 1 is a block diagram showing a configuration of a semiconductor storage device 100 according to a first embodiment. FIG. 2 is a plan view showing an example of a layout of a resistive element region 100b of the semiconductor storage device 100 shown in FIG. 1 in which resisting MTJ elements are electrically connected in series with each other. FIG. 3 is a cross-sectional view showing an example of a cross section taken along the line A-A in FIG. 2. FIG. 4 is a plan view showing an example of a layout of a memory cell array region 100a of the semiconductor storage device 100 shown in FIG. 1. In each drawing, for the sake of simplicity, illustration of an interlayer insulating film, a CMOS substrate circuit, upper wiring or the like is omitted.

As shown in FIG. 1, the semiconductor storage device 100 includes the memory cell array region 100a, the resistive element region 100b and a logic circuit region 100c. Although each region is shown as a single region in FIG. 1, each region may be provided as two or more separate regions.

In the logic circuit region 100c, a controlling circuit that controls an operation or the like of a memory cell including a storing MTJ element "Mm", a driver connected to a bit line or word line connected to the memory cell, and a logic circuit, such as a sense amplifier, are disposed, for example.

In the memory cell array region 100a, a plurality of storing magnetic tunnel junction (MTJ) elements "Mm" that can change resistance depending on the direction of magnetization are arranged on a semiconductor substrate 1 in a matrix along a first direction "X" and a second direction "Y" perpendicular to the first direction "X" (FIG. 4).

The plurality of storing MTJ elements "Mm" may be arranged in a staggered configuration along the first direction "X" and the second direction "Y".

In the resistive element region 100b, a plurality of resisting MTJ elements "Mr" ("Mr1a", "Mr1b", "Mr2a" to "Mr2c", "Mr3a", "Mr3b", "Mr4") that can change resistance depending on the direction of magnetization are arranged on the semiconductor substrate 1 in a matrix along the first direction "X" and the second direction "Y" (FIG. 2).

Although FIG. 2 shows a matrix of five columns of resisting MTJ elements "Mr" arranged in the first direction "X" and three rows of resisting MTJ elements "Mr" arranged in the second direction "Y" as an example, different numbers of resisting MTJ elements "Mr" may be arranged in the first direction "X" and the second direction "Y".

The plurality of resisting MTJ elements "Mr" may be arranged in a staggered configuration along the first direction "X" and the second direction "Y".

The range of the voltage applied to the plurality of resisting MTJ elements "Mr" is set so that a normal use range of energization does not cause a flux reversal (that is, a change of the resistance).

In the following, a resisting MTJ element in the resistive element region 100b will sometimes be generically denoted as a resisting MTJ element "Mr", as required.

As shown in FIG. 3, each resisting MTJ element "Mr" has a layered structure including at least three layers, a first ferromagnetic layer 4, a barrier layer 5 and a second ferromagnetic layer 6 and is formed on a lower electrode 3. The resisting MTJ element "Mr" is embedded in an embedding insulating film 13. The storing MTJ element "Mm" has the same configuration as the resisting MTJ element "Mr".

Of the first ferromagnetic layer 4 and the second ferromagnetic layer 6, one is a pinned layer whose direction of magnetization is fixed, and the other is a free layer whose direction of magnetization is inverted by an external magnetic field or a spin transfer torque.

That is, either of the first and second ferromagnetic layers is a pinned layer, and the other is a free layer. Although this embodiment has been described with regard to a case where the MTJ element has the three-layer structure, the structure of the MTJ element is not limited to the three-layer structure and can be modified in various ways without departing from the spirit of the present invention.

The free layer is made of a metal, such as cobalt, iron, nickel, boron, platinum, palladium, terbium, tantalum, tungsten, iridium and ruthenium, or an alloy thereof or is formed by a laminated film thereof.

The barrier layer is formed by a film of a metal oxide, such as alumina or magnesium oxide, for example.

The lower electrode 3 is made of titanium, tantalum, tungsten, copper or the like or is formed by a film of a nitride thereof.

As shown in FIG. 2, of the plurality of resisting MTJ elements "Mr", pairs of first and second resisting MTJ elements "Mr1a" and "Mr2a" (and "Mr1b" and "Mr2b") adjacent to each other in the first direction "X" are electrically connected in series with each other by the lower electrode 3.

More specifically, the first ferromagnetic layer 4 of the first resisting MTJ element "Mr1a" ("Mr1b") and the first ferromagnetic layer 4 of the second resisting MTJ element "Mr2a" ("Mr2b") are electrically connected to each other by the lower electrode 3.

Furthermore, the second resisting MTJ element "Mr2a" and the first resisting MTJ element "Mr1b", which is adjacent to the second resisting MTJ element "Mr2a" in the first direction "X", are electrically connected to each other by an upper electrode 8.

More specifically, the second ferromagnetic layer 6 of the second resisting MTJ element "Mr2a" and the second ferromagnetic layer 6 of the first resisting MTJ element "Mr1b" are electrically connected to each other by the upper electrode 8.

Furthermore, the second resisting MTJ element "Mr2b" and a third resisting MTJ element "Mr3b", which is adjacent to the second resisting MTJ element "Mr2a" in the second direction "Y", are electrically connected to each other by the upper electrode 8.

More specifically, the second ferromagnetic layer 6 of the second resisting MTJ element "Mr2b" and the second ferromagnetic layer 6 of the third resisting MTJ element "Mr3b" are electrically connected to each other by the upper electrode 8.

As shown in FIGS. 2 and 4, a first cross section of the plurality of resisting MTJ elements "Mr" and a second cross section of the plurality of storing MTJ elements "Mm" have a substantially rectangular shape. In particular, the first cross section is substantially elongated rectangular, and the second cross section is substantially square.

A length "dx" of a side of the first cross section in the first direction "X" is longer than a length "du" (which corresponds to a minimum working size "F") of a side of the second cross section in the first direction "X". For example, the side length "dx" is twice as long as the side length "du".

That is, an area (dx×dy) of the first cross section of the resisting MTJ element "Mr" parallel with an upper surface of the semiconductor substrate 1 is larger than an area (dx×dy) of the second cross section of the storing MTJ element "Mm" parallel with the upper surface of the semiconductor substrate 1.

In this way, the thermal agitation of the resisting MTJ elements "Mr" can be improved to prevent flux reversal of the resisting MTJ elements "Mr".

As shown in FIGS. 2 and 4, for example, a first distance "d1" between the first resisting MTJ element "Mr1a" ("Mr1b") and the second resisting MTJ element "Mr2a" ("Mr2b") is shorter than a reference distance "da" between adjacent two of the plurality of storing MTJ elements "Mm". The first distance "d1" is approximately equal to the minimum working size "F" of the manufacturing process of the semiconductor storage device 100 and is approximately a half of the reference distance "da", for example.

The first distance "d1" is shorter than a second distance "d2" between the second MTJ element "Mr2a" and the first resisting MTJ element "Mr1b" electrically connected in series with each other by the upper electrode 8. The first distance "d1" is approximately a half of the second distance "d2", for example.

The first distance "d1" is shorter than a third distance "d3" between the resisting MTJ elements "Mr2a" and "Mr3a" that are adjacent to each other in the second direction "Y" and are not electrically connected to each other. The first distance "d1" is approximately two thirds of the third distance "d3", for example.

With the layout described above, ion beam etching (IBE) described later can be selectively performed in such a manner that the lower electrode 3 between the first resisting MTJ element "Mr1a" ("Mr1b") and the second resisting MTJ element "Mr2a"("Mr2b") adjacent to each other in the first direction "X" survives the etching.

Next, physical properties of the resisting MTJ elements "Mr" having the configuration described above will be described.

In general, desirable specifications for the circuit element are as follows: the sheet resistance ρs>100 Ω/square, the temperature characteristics of the resistive element <0.1%/K, the process variation 3σ<10%, and the fluctuation of all the resistive elements <20%, for example.

As described above, according to this embodiment, the resisting MTJ element "Mr" has a larger area than the storing MTJ element "Mm". The MTJ films of the resisting MTJ element "Mr" and the storing MTJ element "Mm" have the same configuration, and the resistance decreases in inverse proportion to the area.

When the MTJ element serves as a resistive element, 0/1 inversion of the resistance is undesirable. The area of the first cross section of the resisting MTJ element "Mr" can be twice or more as large as that of the storing MTJ element "Mm", thereby improving the resistance to the thermal agitation and preventing the flux reversal, for example.

Figure 5:
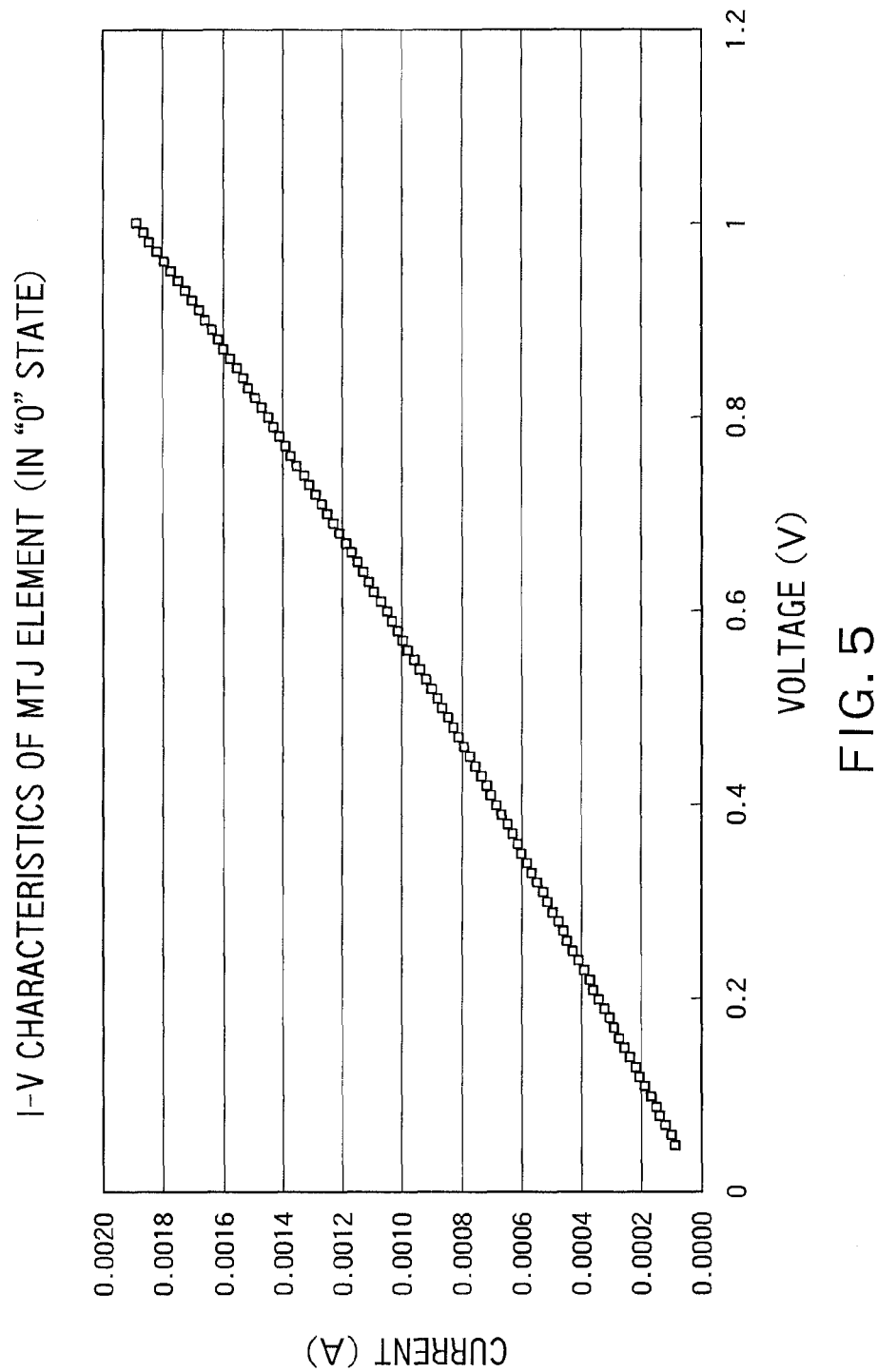
FIG. 5 is a graph showing an example of current-voltage characteristics of the resisting MTJ element "Mr" of the semiconductor storage device 100 according to the first embodiment.
Figure 6:
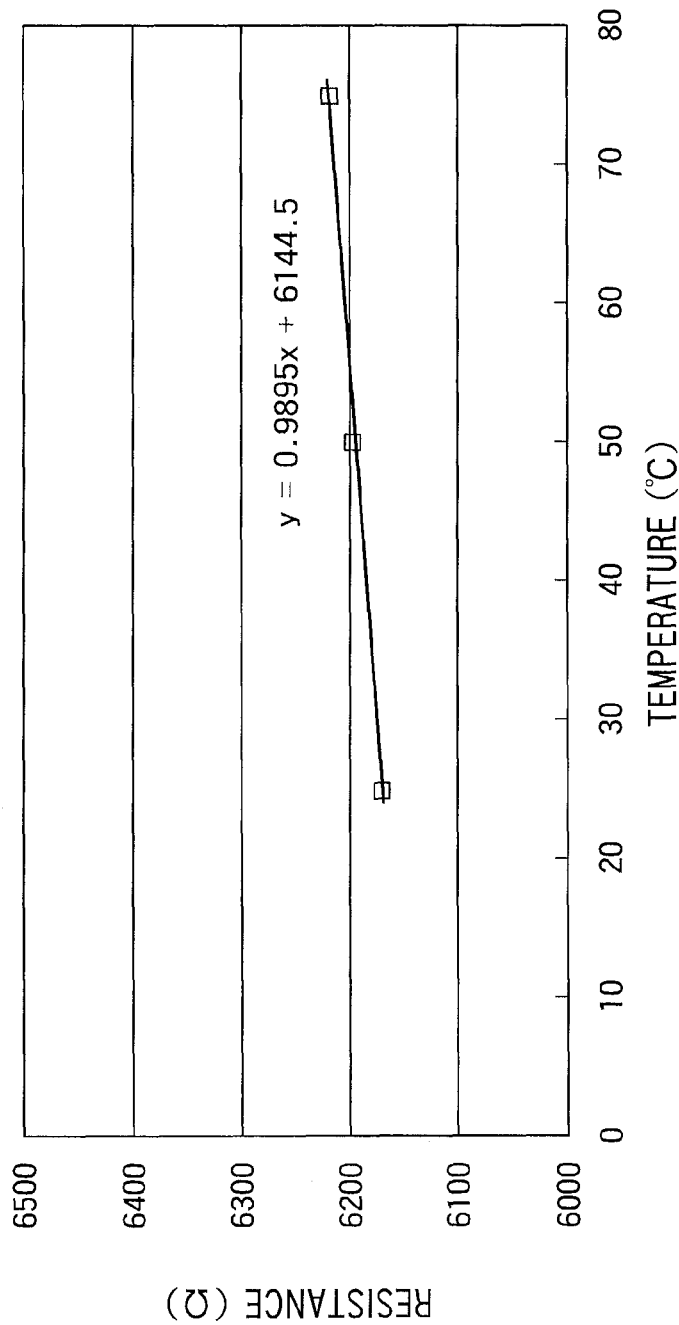
FIG. 6 is a graph showing an example of temperature characteristics of the resisting MTJ element "Mr" of the semiconductor storage device 100 according to the first embodiment.

FIG. 5 is a graph showing an example of current-voltage characteristics of the resisting MTJ element "Mr" of the semiconductor storage device 100 according to the first embodiment. FIG. 6 is a graph showing an example of temperature characteristics of the resisting MTJ element "Mr" of the semiconductor storage device 100 according to the first embodiment.

The resisting MTJ element "Mr" shown in FIGS. 5 and 6 has a cross-sectional area (size) of 80 nm×120 nm and a resistance of 6.2 kΩ. In FIGS. 5 and 6, the resisting MTJ element "Mr" is in a "0" state (a state where the directions of magnetization of the free layer and the pinned layer are parallel with each other).

As shown in FIG. 5, the resisting MTJ element has a better linearity than conventional resistive elements. The resisting MTJ element "Mr" has a better current linearity in the "0" state where the directions of magnetization of the free layer and the pinned layer are parallel with each other than in a "1" state where the directions of magnetization of the free layer and the pinned layer are not parallel with each other. Therefore, the resisting MT) element is desirably used in the "0" state.

In addition, as shown in FIG. 6, the resisting MTJ element "Mr" has good temperature characteristics (0.9895 Ω/K), and the resistance is less likely to change when the temperature rises or falls. The temperature characteristics is equivalent to 0.01%/K, which is approximately a tenth of that of conventional resistive elements and is extremely good.

Although not shown, the temperature characteristics of the resisting MTJ element "Mr" in the "1" state is such that the resistance changes with temperature approximately ten times more significantly than that in the "0" state.

Therefore, the resisting MTJ element "Mr" is preferably serves as a resistive element in the "0" state where the directions of magnetization of the free layer and the pinned layer are parallel with each other.

Next, an example of a method of manufacturing the semiconductor storage device 100 having the configuration described above will be described.

FIGS. 7 to 10 are cross-sectional views of the resistive element region 100b of the semiconductor storage device 100 according to the first embodiment for illustrating examples of steps of the method of manufacturing the same.

Figure 7:
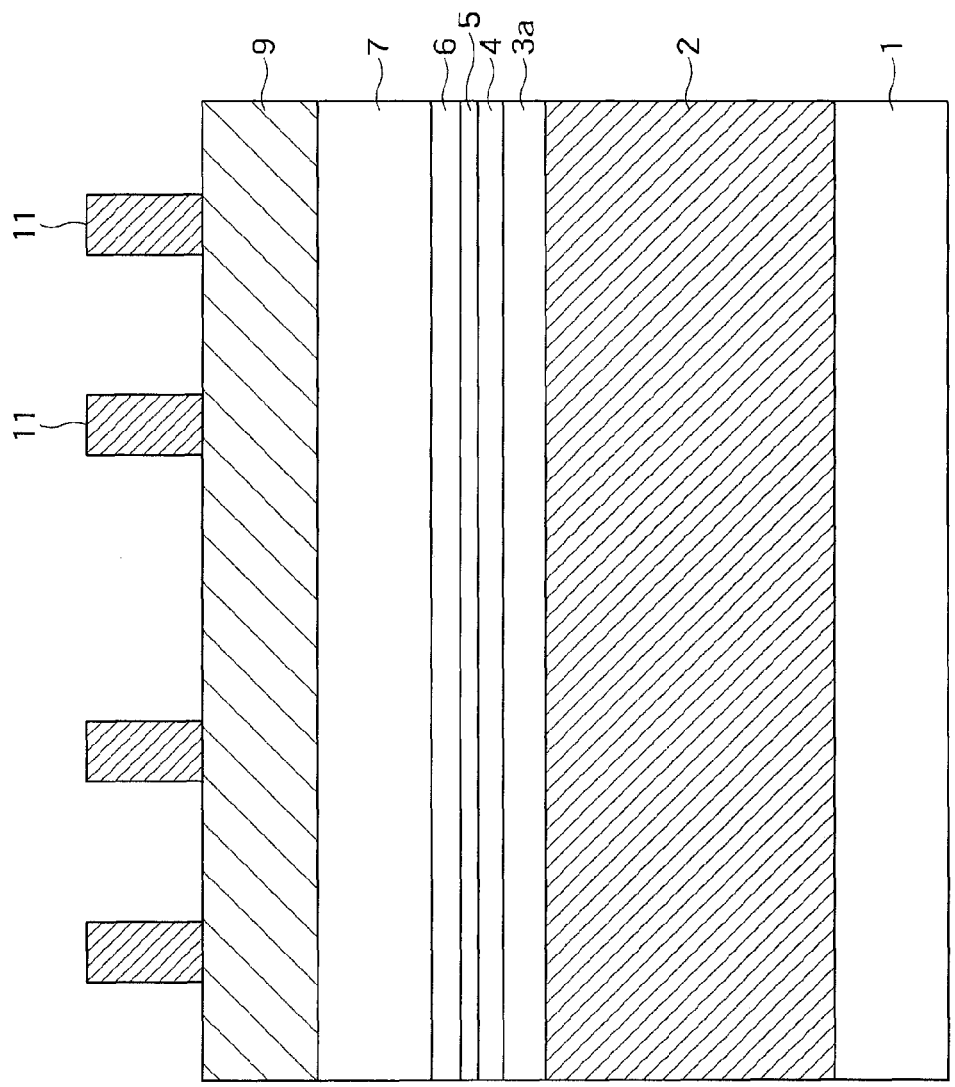
FIG. 7 is a cross-sectional view of the resistive element region 100b of the semiconductor storage device 100 according to the first embodiment for illustrating examples of steps of the method of manufacturing the same.

First, as in the common semiconductor memory process, on the semiconductor substrate 1, a source/drain region, a gate region, a bit line contact wire and the like (not shown) are formed, and an interlayer insulating film 2 is deposited (FIG. 7).

Next, as shown in FIG. 7, a first conductive layer 3a that is to form the lower electrode 3 is deposited on the interlayer insulating film 2 on the semiconductor substrate 1, the first ferromagnetic layer 4, the barrier layer 5 and the second ferromagnetic layer 6 that are to form the MTJ element are deposited on the first conductive layer 3a, a metal hard mask layer 7 made of TiN, Ta or the like that is conductive, for example, is deposited on the second ferromagnetic layer 6, and a hard mask layer 9 formed by an insulating film, such as SiO2, is deposited on the metal hard mask layer 7.

Furthermore, a resist film 11 is deposited on the hard mask layer 9 and then patterned by lithography so that the resist film 11 remains on the region where the resisting MTJ element "Mr" is to be formed (FIG. 7).

Using the patterned resist film 11 as a mask, the hard mask layer 9 and the metal hard mask layer 7 are then selectively etched to form a mask film for processing the MTJ film.

Using the mask film selectively formed on the region where the resisting MTJ element "Mr" is to be formed as a mask, the metal hard mask layer is then selectively etched by reactive ion etching (RIE) or the like.

Figure 8:
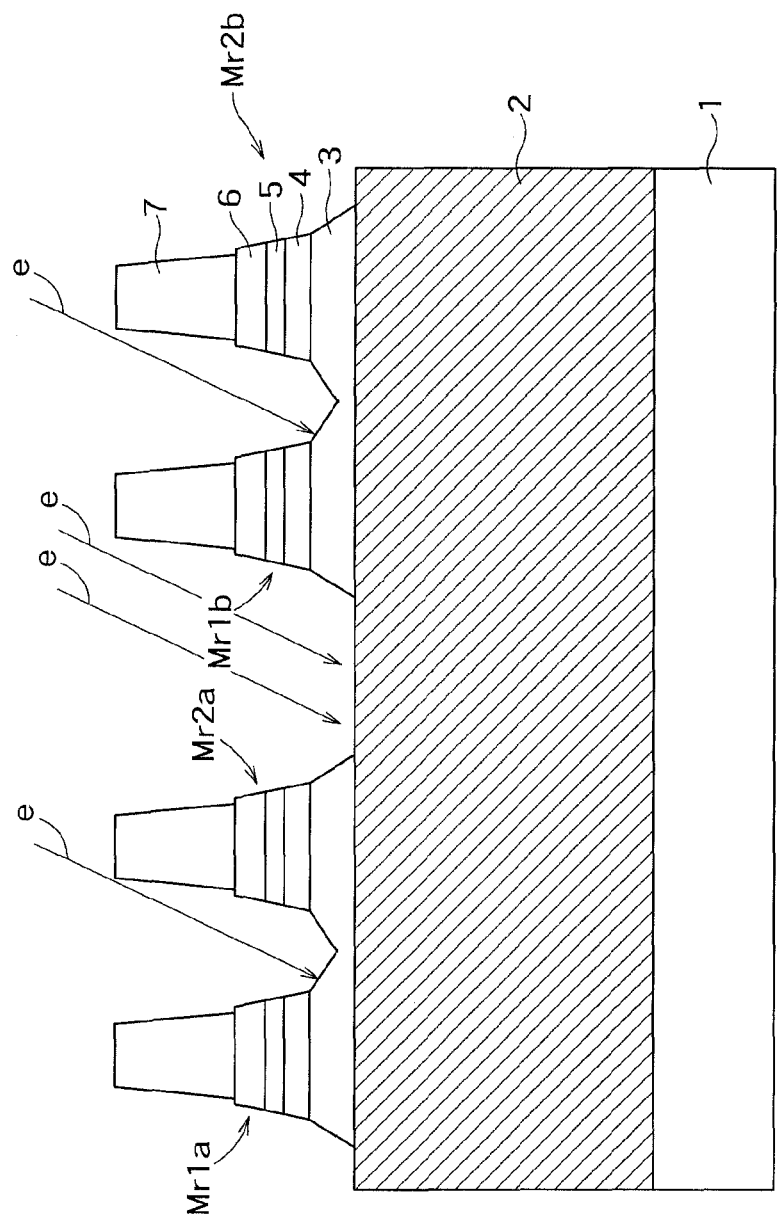
FIG. 8 is a cross-sectional view of the resistive element region 100b of the semiconductor storage device 100 according to the first embodiment for illustrating examples of steps of the method of manufacturing the same, is continuous from FIG. 7.

Next, as shown in FIG. 8, using the etched metal hard mask layer 7 as a mask, the MTJ film (the second ferromagnetic layer 6, the barrier layer 5 and the first ferromagnetic layer 4) is etched by ion beam etching (IBE) with the angle of incidence of an ion beam "e" inclined with respect to a perpendicular to the upper surface of the semiconductor substrate 1 to form the resisting MTJ element "Mr", and the first conductive layer 3a is selectively etched to form the lower electrode 3.

As described above, the first distance "d1" between the first resisting MTJ element "Mr1a" ("Mr1b") and the second resisting MTJ element "Mr2a" ("Mr2b") adjacent to each other in the first direction "X" of the plurality of resisting MTJ elements "Mr" is shorter than the reference distance "da" between adjacent two of the plurality of storing MTJ elements "Mm" arranged in a matrix in the memory cell array region 100a.

Thus, in the IBE, the ion beam "e" entering the narrower space between the metal hard mask layers 7 on the first and second resisting MTJ elements "Mr1a" ("Mr1b") and "Mr2a" ("Mr2b") is blocked by the adjacent resisting MTJ elements "Mr1a" ("Mr2a") and "Mr2a" ("Mr2b"). As a result, etching of the first conductive layer 3a stops halfway in this space.

On the other hand, as described above, the second distance "d2" between the second resisting MTJ element "Mr2a" and the resisting MTJ element "Mr1b" adjacent to the second resisting MTJ element "Mr2a" in the first direction "X" is approximately equal to the reference distance "da" and is longer than the first distance "d1"

Therefore, in the space between the resisting MTJ elements "Mr2a" and "Mr1b" adjacent to each other at the second distance "d2", the first conductive layer 3a is etched until the interlayer insulating film 2 is exposed.

That is, in the narrower space between the first and second resisting MTJ elements "Mr1a" ("Mr1b") and "Mr2a" ("Mr2b"), the first conductive layer 3a is not completely etched, and the first conductive layer 3a remains, while the first conductive layer 3a is etched until the interlayer insulating film 2 is exposed in the other regions.

As described above, the first conductive layer 3a is selectively etched by IBE so that the first conductive layer 3a remains in the space between the first and second resisting elements "Mr1a" ("Mr1b") and "Mr2a" ("Mr2b").

In the memory cell array region 100a, adjacent two resisting MTJ elements "Mm" are at the reference distance "da" as described above. Therefore, in the space between adjacent storing MTJ elements "Mm", the first conductive layer is etched until the interlayer insulating film 2 is exposed.

In this way, in formation of the lower electrodes 3, the lower electrodes 2 of the adjacent first and second resisting MTJ element "Mr1a" and "Mr2a" can be connected to each other without performing additional exposure.

These steps of processing the resistive element region 100b can be performed at the same time with the formation of the memory cells in the memory cell array region 100a, thereby reducing the increase of the manufacturing cost.

Next, the processed resisting MTJ element "Mr" is covered with a protective film 12 of SiN, AlO$_x$ or the like and then embedded in the embedding insulating film 13 of SiO$_2$ or the like. Using the protective film 12 made of SiN or the like on the metal hard mask layer 7 as a stopper, the top of the embedding insulating film 13 is planarized by CMP or the like.

Figure 9:
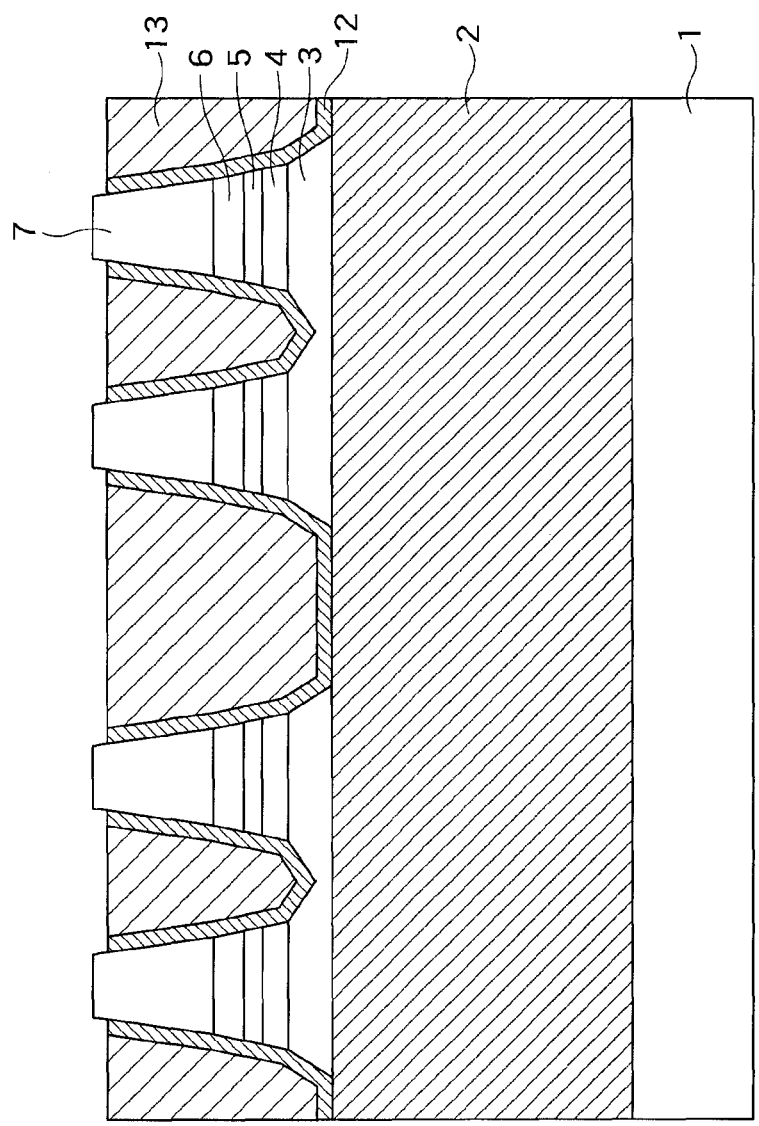
FIG. 9 is a cross-sectional view of the resistive element region 100b of the semiconductor storage device 100 according to the first embodiment for illustrating examples of steps of the method of manufacturing the same, is continuous from FIG. 8.

Next, as shown in FIG. 9, the protective film 12 is etched back by IBE or RIE, for example, to exposure a top part of the metal hard mask layer 7.

That is, through the steps described above, the embedding insulating film 13 is formed on the semiconductor substrate 1 so that the etched first conductive layer 3a (lower electrode 3), the etched first ferromagnetic layer 4, the etched barrier layer 5 and the etched second ferromagnetic layer 6 are embedded in the embedding insulating film 13 with at least a top part of the metal hard mask layer 7 exposed.

Figure 10:
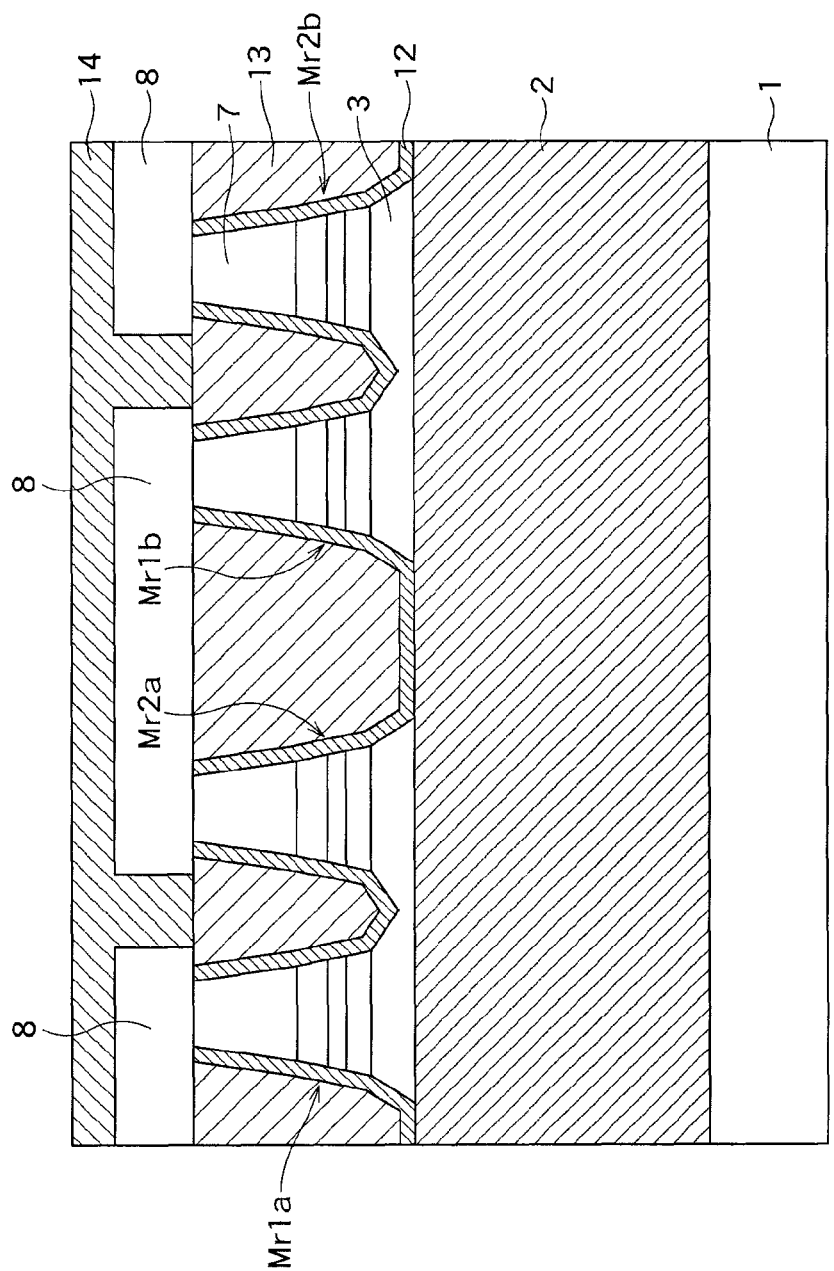
FIG. 10 is a cross-sectional view of the resistive element region 100b of the semiconductor storage device 100 according to the first embodiment for illustrating examples of steps of the method of manufacturing the same, is continuous from FIG. 9.

Next, as shown in FIG. 10, a film of TiN, Ta, W or the like is deposited and then patterned by lithography into an island. In this way, the upper electrode 8 electrically connected to the exposed top part of the metal hard mask layer 7 is formed.

As a result, for example, as shown in FIG. 2 described earlier, the second resisting MTJ element "Mr2a" and the first resisting MTJ element "Mr1b" adjacent to each other in the first direction "X" are electrically connected to each other by the upper electrode 8, and the second resisting MTJ element "Mr2b" and the third resisting MTJ element "Mr3b" adjacent to each other in the second direction "Y" are also electrically connected to each other by the upper electrode 8.

Through the steps described above, a resistive element having an arbitrary high resistance formed by a plurality of resisting MTJ elements "Mr" electrically connected in series with each other can be formed in the resistive element region 100b.

Furthermore, because of the configuration in which the resisting MTJ elements "Mr" are electrically connected in series with each other as described above, the resistances of resistive elements are averaged. That is, variations in resistance among resistive elements formed by a plurality of resisting MTJ elements can be reduced.

Next, an interlayer insulating film 14, such as a silicon oxide film, is deposited, and a wiring step or the like is performed to complete the process of manufacturing the semiconductor storage device 100.

As described above, in the method of manufacturing the semiconductor storage device 100 described above, resisting MTJ elements electrically connected in series with each other can be formed in the resistive element region while reducing the increase of the manufacturing cost.

As described above, in the semiconductor storage device according to the first embodiment, or according to the method of manufacturing the same, the MTJ elements connected in series with each other can serve as resistive bodies having desired characteristics, and the increase of the manufacturing cost can be reduced.

Second Embodiment

In the above first embodiment, an example of the configuration in which adjacent resisting MTJ elements are electrically connected in series with each other by the lower electrodes has been described.

However, a resistive element can be formed as far as adjacent resisting MTJ elements are electrically connected in series with each other.

Thus, in a second embodiment, an example of a configuration in which adjacent resisting MTJ elements are electrically connected in series with each other by bit line contact wires will be described.

Figure 11:
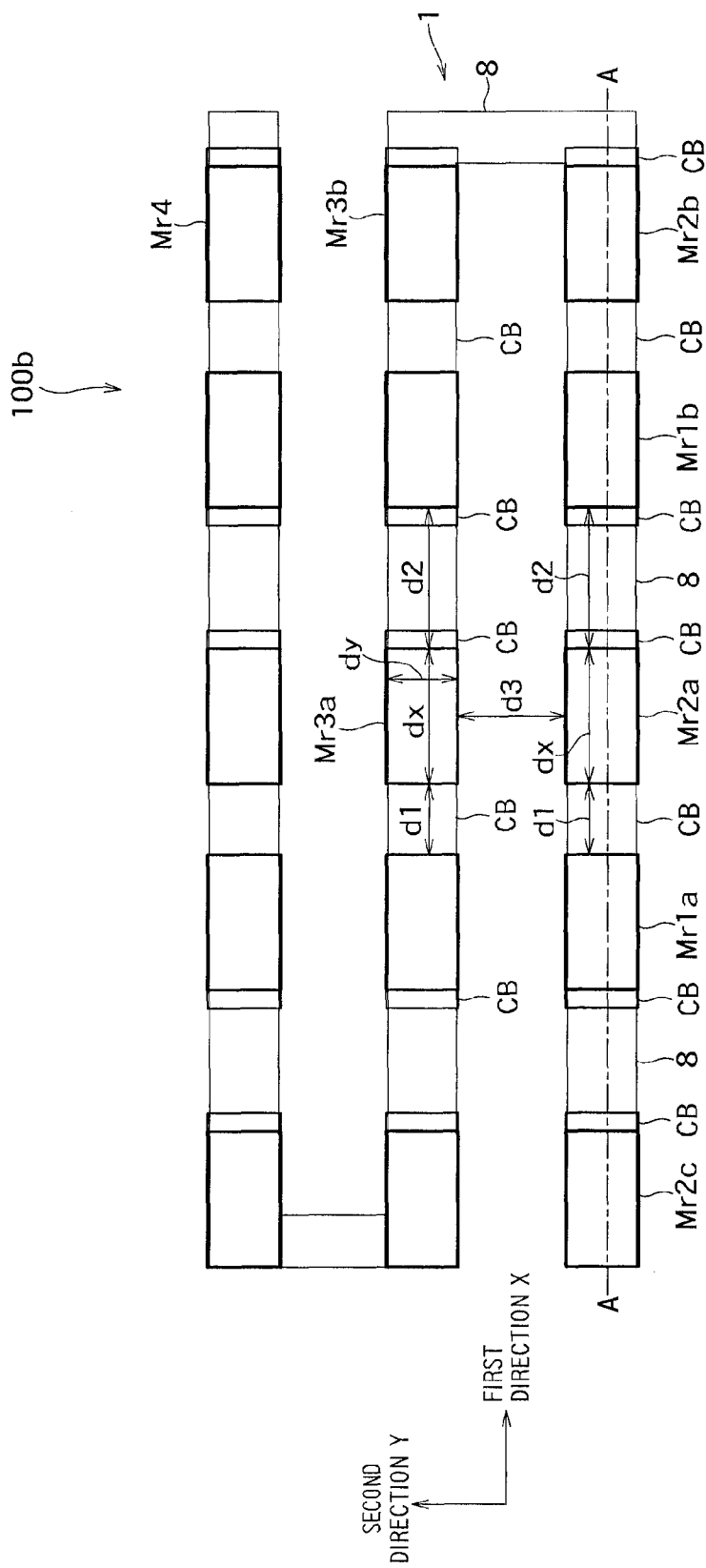
FIG. 11 is a plan view showing another example of the layout of the resistive element region 100b of the semiconductor storage device 100 shown in FIG. 1 in which resisting MTJ elements are electrically connected in series with each other.
Figure 12:
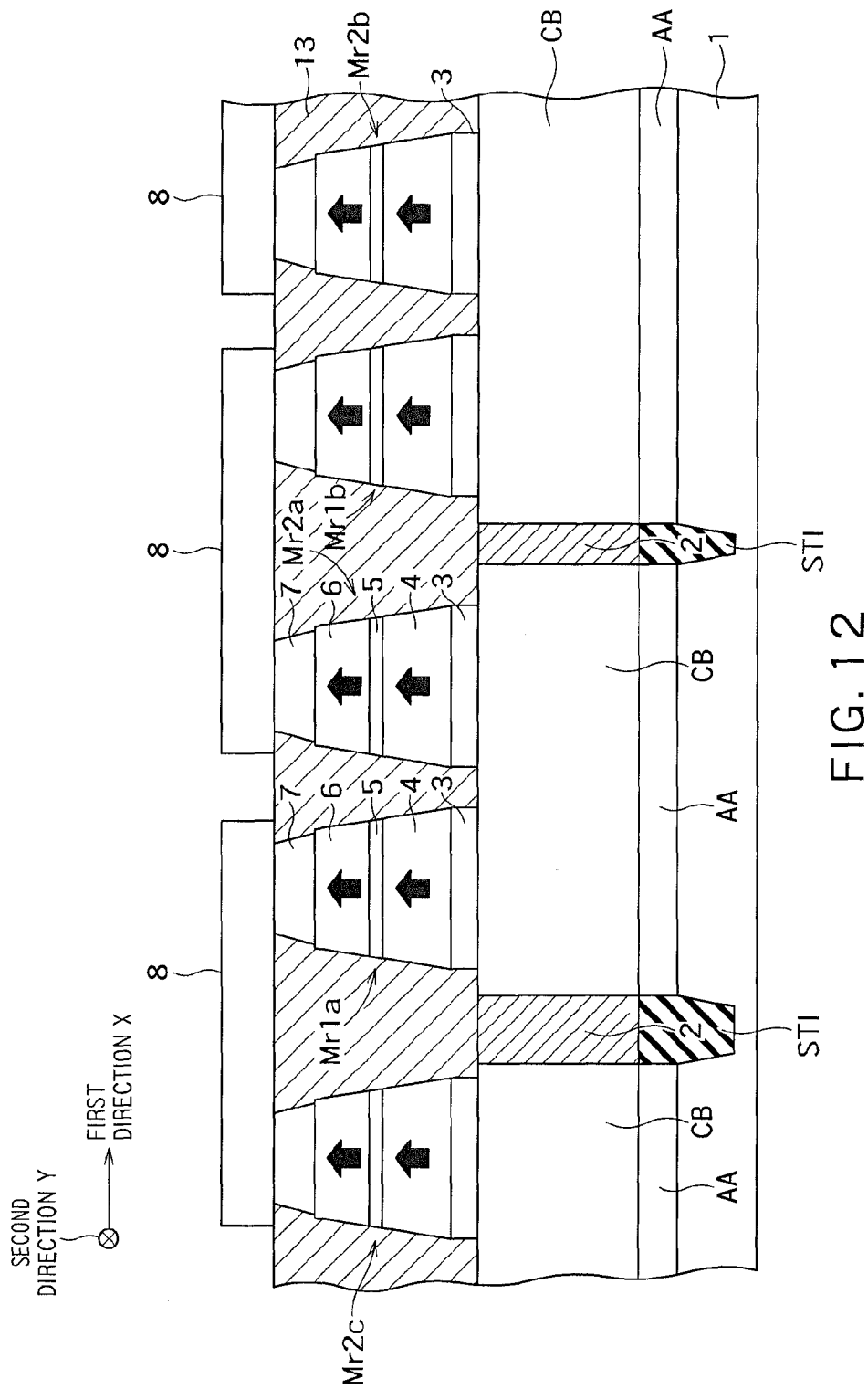
FIG. 12 is a cross-sectional view showing an example of a cross section taken along the line A-A in FIG. 11.

FIG. 11 is a plan view showing another example of the layout of the resistive element region 100b of the semiconductor storage device 100 shown in FIG. 1 in which resisting MTJ elements are electrically connected in series with each other. FIG. 12 is a cross-sectional view showing an example of a cross section taken along the line A-A in FIG. 11. In FIGS. 11 and 12, the same reference symbols as those in FIGS. 2 and 3 denote the same components as in the first embodiment.

As shown in FIGS. 11 and 12, for example, the first and second resisting MD elements "Mr1a" and "Mr2a" ("Mr1b" and "Mr2b") are electrically connected in series with each other by a bit line contact wire "CB", which is electrically connected to the lower electrodes 3.

Adjacent bit line contact wires "CB" are insulated from each other by the interlayer insulating films 2. In this embodiment, the bit line contact wires "CB" are electrically connected to active areas "AA" formed on the semiconductor substrate 1. Shallow trench isolations (STIs) are formed in the semiconductor substrate 1 to insulate adjacent active areas "AA" from each other.

That is, the first ferromagnetic layer 4 of the first resisting MTJ element "Mr1a" ("Mr1b") and the first ferromagnetic layer 4 of the second resisting MTJ element "Mr2a" ("Mr2b") are electrically connected to each other by the bit line contact wire "CB".

In the first embodiment described above, there are restrictions on the conditions of processing the MTJ elements.

However, in the processing of the MTJ elements shown in FIGS. 11 and 12, the lower electrodes 3 in the spaces between the adjacent MTJ elements are completely etched regardless of the widths of the spaces.

As a result, as described above, in the second embodiment, the first resisting MTJ element "Mr1a" ("Mr1b") and the second resisting MTJ element "Mr2a" ("Mr2b") can be electrically connected to each other by the bit line contact wire "CB" instead of the lower electrode 3.

In this case, if the bit line contact wire "CB" has a significant resistance, the resistance needs to be taken into consideration in design of the resistance of the resistive element.

The remainder of the configuration of the semiconductor storage device 100 is the same as that in the first embodiment.

As described above, in the semiconductor storage device according to the second embodiment, the MTJ elements connected in series with each other can serve as resistive bodies having desired characteristics, and the increase of the manufacturing cost can be reduced.

Third Embodiment

In a third embodiment, an example of a configuration in which adjacent resisting MTJ elements are electrically connected in series with each other by active areas will be described.

Figure 13:
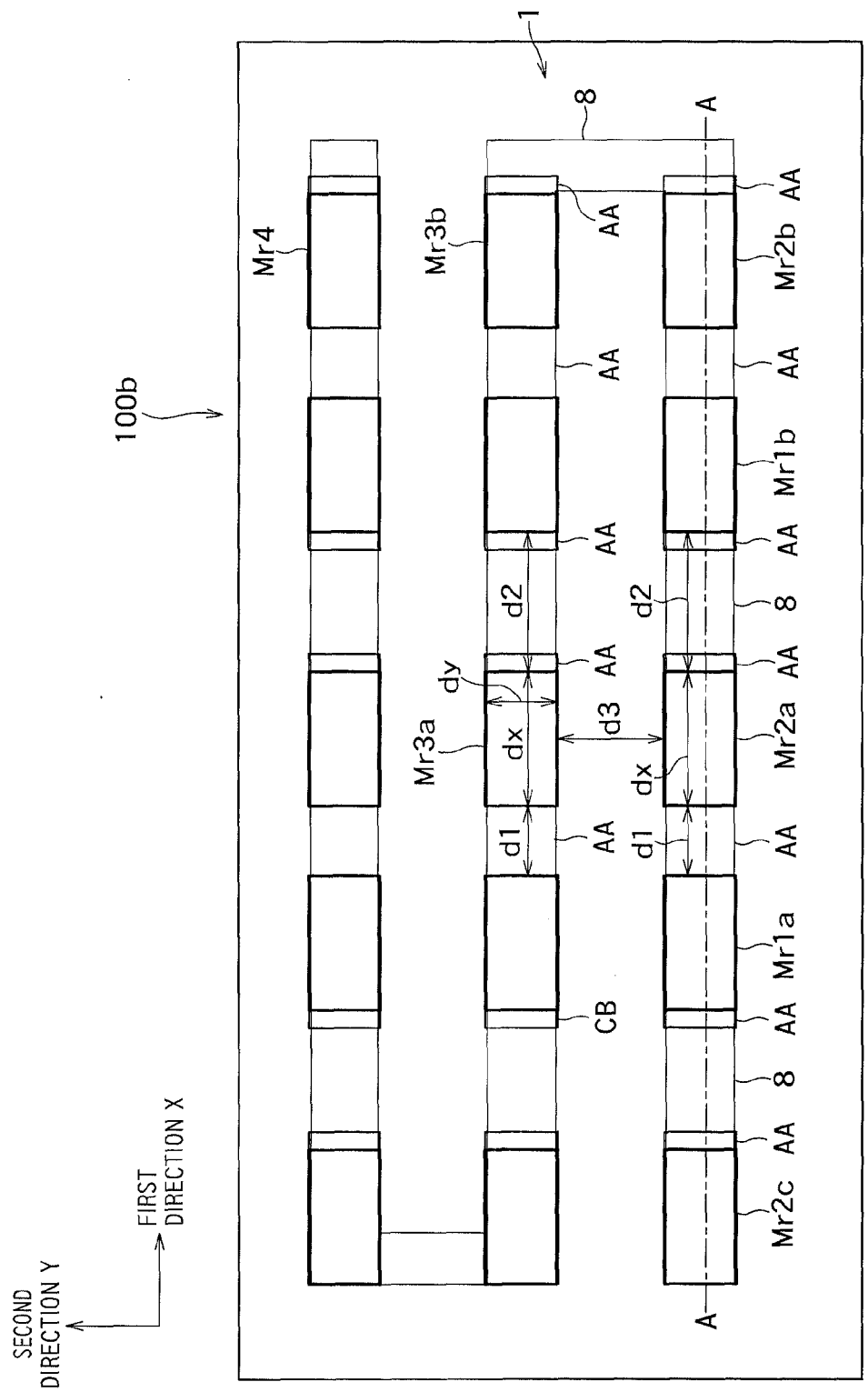
FIG. 13 is a plan view showing another example of the layout of the resistive element region 100b of the semiconductor storage device 100 shown in FIG. 1 in which resisting MTJ elements are electrically connected in series with each other.
Figure 14:
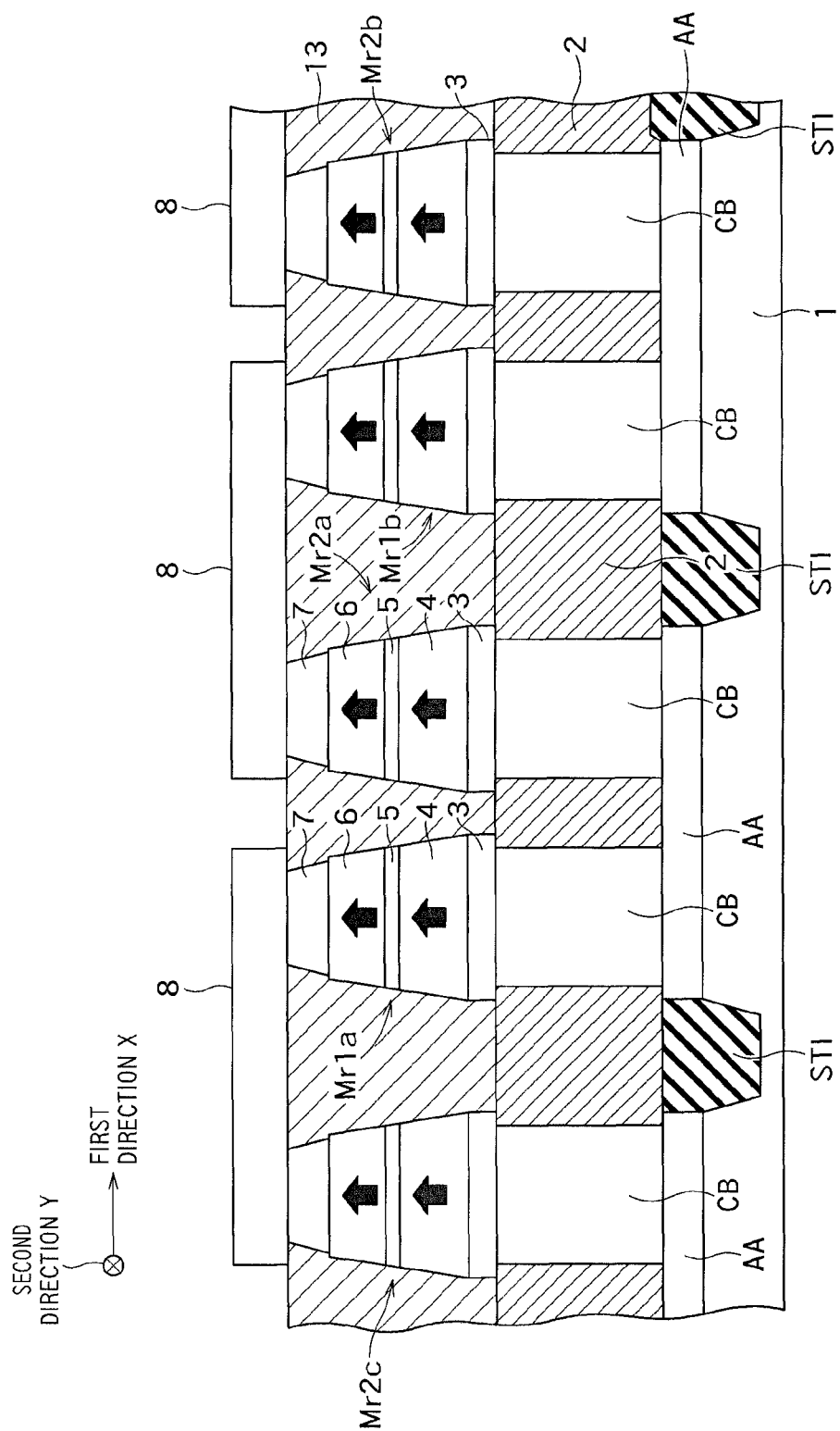
FIG. 14 is a cross-sectional view showing an example of a cross section taken along the line A-A in FIG. 13.

FIG. 13 is a plan view showing another example of the layout of the resistive element region 100b of the semiconductor storage device 100 shown in FIG. 1 in which resisting MTJ elements are electrically connected in series with each other. FIG. 14 is a cross-sectional view showing an example of a cross section taken along the line A-A in FIG. 13. In FIGS. 13 and 14, the same reference symbols as those in FIGS. 2, 3, 11 and 12 denote the same components as in the embodiments 1 and 2.

As shown in FIGS. 13 and 14, for example, the first and second resisting MTJ elements "Mr1a" and "Mr2a" ("Mr1b" and "Mr2b") are electrically connected in series with each other by the active area "AA" formed on the semiconductor substrate 1. The resisting MTJ elements "Mr" and the active area "AA" are electrically connected to each other via the lower electrodes 3 and the bit line contact wires "CB".

As in the second embodiment, adjacent bit line contact wires "CB" are insulated from each other by the interlayer insulating films 2. In this embodiment, the bit line contact wires "CB" are electrically connected to the active areas "AA" formed on the semiconductor substrate 1. STI or the like is formed in the semiconductor substrate 1 to insulate adjacent active areas "AA" from each other.

That is, the first ferromagnetic layer 4 of the first resisting MTJ element "Mr1a" ("Mr1b") and the first ferromagnetic layer 4 of the second resisting MTJ element "Mr2a" ("Mr2b") are electrically connected to each other by the bit line contact wire "CB".

In the first embodiment described above, there are restrictions on the conditions of processing the MTJ elements.

However, in the processing of the MTJ elements shown in FIGS. 11 and 12, the lower electrodes 3 in the spaces between the adjacent MTJ elements are completely etched regardless of the widths of the spaces.

As a result, as described above, in the second embodiment, the first resisting MTJ element "Mr1a" ("Mr1b") and the second resisting MTJ element "Mr2a" ("Mr2b") can be electrically connected to each other by the active area "AA" instead of the lower electrode 3.

In this case, if the bit line contact wire "CB" or the active area "AA" has a significant resistance, the resistance needs to be taken into consideration in design of the resistance of the resistive element.

The remainder of the configuration of the semiconductor storage device 100 is the same as that in the embodiments 1 and 2.

As described above, in the semiconductor storage device according to the third embodiment, the MTJ elements connected in series with each other can serve as resistive bodies having desired characteristics, and the increase of the manufacturing cost can be reduced.

Fourth Embodiment

In the above embodiments 1 to 3, examples of the configuration in which adjacent resisting MTJ elements are electrically connected in series with each other have been described.

That is, the circuit has an arbitrary resistance equal to or higher than the resistance of the storing MTJ elements.

However, the circuit design may require a resistive body having a resistance equal to or lower than the resistance of the storing MTJ elements.

Thus, in a fourth embodiment, an example of a configuration in which adjacent resisting MTJ elements are electrically connected in parallel with each other will be described.

Figure 15:
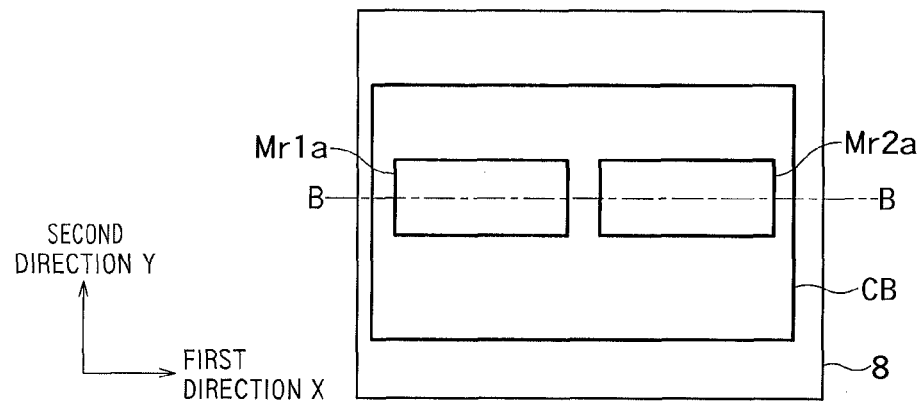
FIG. 15 is a plan view showing an example of a layout of the resistive element region 100b of the semiconductor storage device 100 shown in FIG. 1 in which resisting MTJ elements are electrically connected in parallel with each other.
Figure 16:
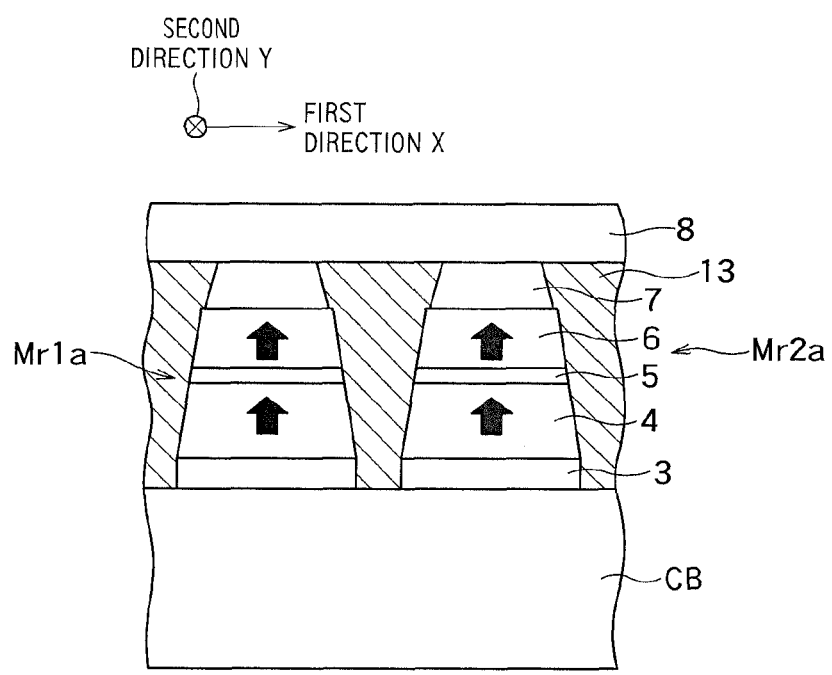
FIG. 16 is a cross-sectional view showing an example of a cross section taken along the line B-B in FIG. 15.

FIG. 15 is a plan view showing an example of a layout of the resistive element region 100b of the semiconductor storage device 100 shown in FIG. 1 in which resisting MTJ elements are electrically connected in parallel with each other. FIG. 16 is a cross-sectional view showing an example of a cross section taken along the line B-B in FIG. 15. In FIGS. 15 and 16, the same reference symbols as those in FIGS. 2 and 3 denote the same components as in the first embodiment. In FIGS. 15 and 16, for the sake of simplicity, illustration of the interlayer insulating film, the semiconductor substrate and the like is omitted.

As shown in FIGS. 15 and 16, for example, the first and second resisting MTJ elements "Mr1a" and "Mr2a" adjacent to each other in the first direction "X" of the plurality of resisting MTJ elements are electrically connected to each other by the bit line contact wire "CB", which is electrically connected to the lower electrodes 3, and are further electrically connected to each other by the upper electrode 8.

In this embodiment, the first ferromagnetic layer 4 of the first resisting MTJ element "Mr1a" and the first ferromagnetic layer 4 of the second resisting MTJ element "Mr2a" are electrically connected to each other by the bit line contact wire "CB", and the second ferromagnetic layer 6 of the first resisting MTJ element "Mr1a" and the second ferromagnetic layer 6 of the second resisting MTJ element "Mr2a" are electrically connected to each other by the upper electrode 8.

That is, the first and second resisting MTJ elements "Mr1a" and "Mr2a" are electrically connected in parallel with each other between the upper electrode 8 and the bit line contact wire "CB".

Adjacent bit line contact wires "CB" are insulated from each other by the interlayer insulating films 2.

In this case, if the bit line contact wire "CB" has a significant resistance, the resistance needs to be taken into consideration in design of the resistance of the resistive element.

Figure 17:
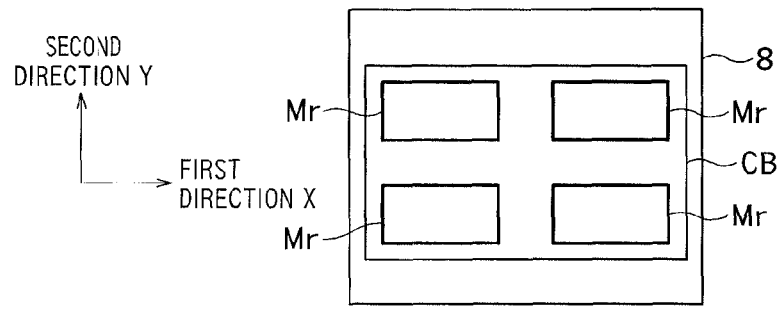
FIG. 17 is a plan view showing other examples of the layout of the resistive element region 100b of the semiconductor storage device 100 shown in FIG. 1 in which resisting MTJ elements are electrically connected in parallel with each other.
Figure 18:
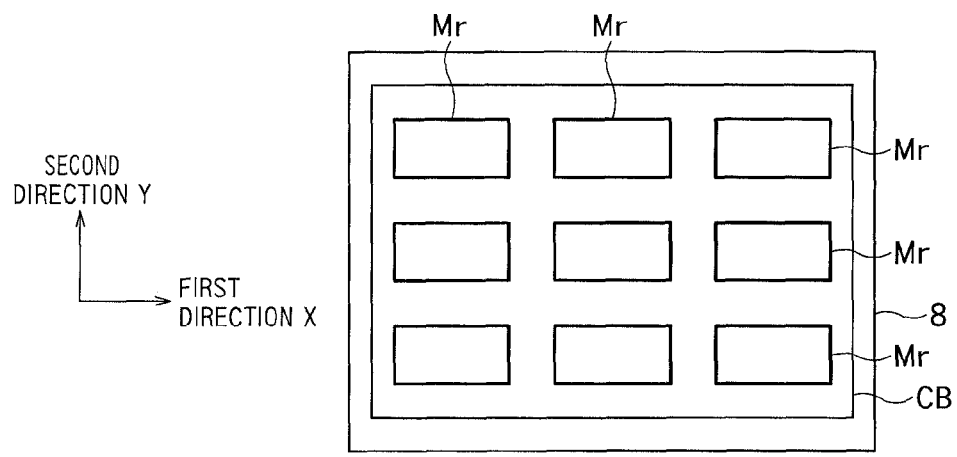
FIG. 18 is a plan view showing other examples of the layout of the resistive element region 100b of the semiconductor storage device 100 shown in FIG. 1 in which resisting MTJ elements are electrically connected in parallel with each other.
Figure 19:
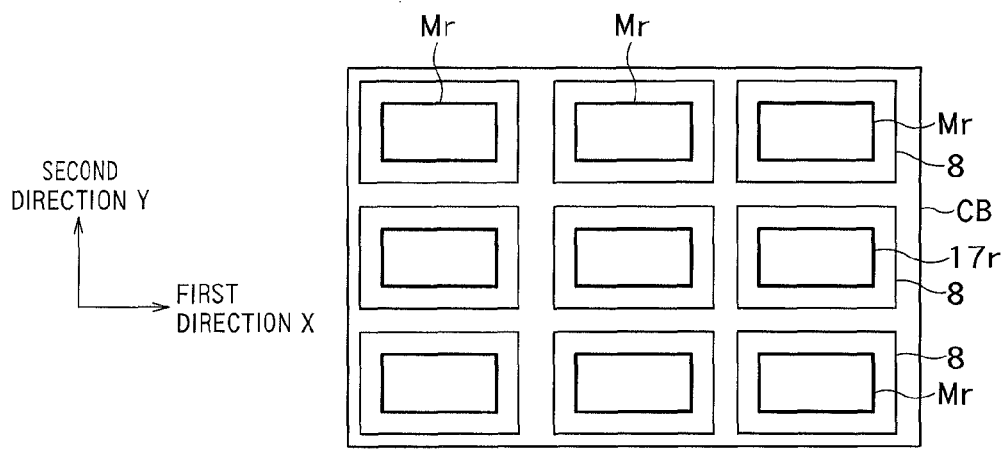
FIG. 19 is a plan view showing other examples of the layout of the resistive element region 100b of the semiconductor storage device 100 shown in FIG. 1 in which resisting MTJ elements are electrically connected in parallel with each other.

FIGS. 17 to 19 are plan views showing other examples of the layout of the resistive element region 100b of the semiconductor storage device 100 shown in FIG. 1 in which resisting MTJ elements are electrically connected in parallel with each other.

As shown in FIGS. 17 and 18, more resisting MTJ elements "Mr" than those in the example shown in FIG. 15 can be electrically connected in parallel with each other. In those cases, the resistance of the resistive element can be designed to be lower.

As shown in FIG. 19, the upper electrode 9 can be divided as required and connected in parallel with each other by an upper wiring layer. By using the plurality of resisting MTJ elements "Mr", a process variation, such as a resistance variation due to a size variation, can be reduced.

As described above, the resistance of the resistive element can be designed to be lower by forming the resistive element by electrically connecting a plurality of resisting MTJ element "Mr" in parallel with each other between the upper electrode 8 and the bit line contact wire "CB".

The remainder of the configuration of the semiconductor storage device 100 is the same as that in the first embodiment.

As described above, in the semiconductor storage device according to the fourth embodiment, the MTJ elements connected in series with each other can serve as resistive bodies having desired characteristics, and the increase of the manufacturing cost can be reduced.

Fifth Embodiment

In a fifth embodiment, another example of the configuration in which adjacent resisting MTJ elements are electrically connected in parallel with each other will be described.

Figure 20:
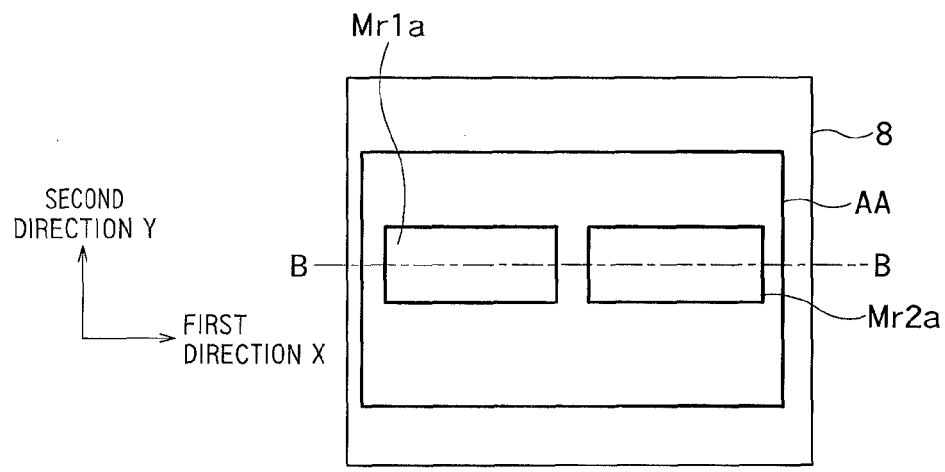
FIG. 20 is a plan view showing an example of the layout of the resistive element region 100b of the semiconductor storage device 100 shown in FIG. 1 in which resisting MTJ elements are electrically connected in parallel with each other.
Figure 21:
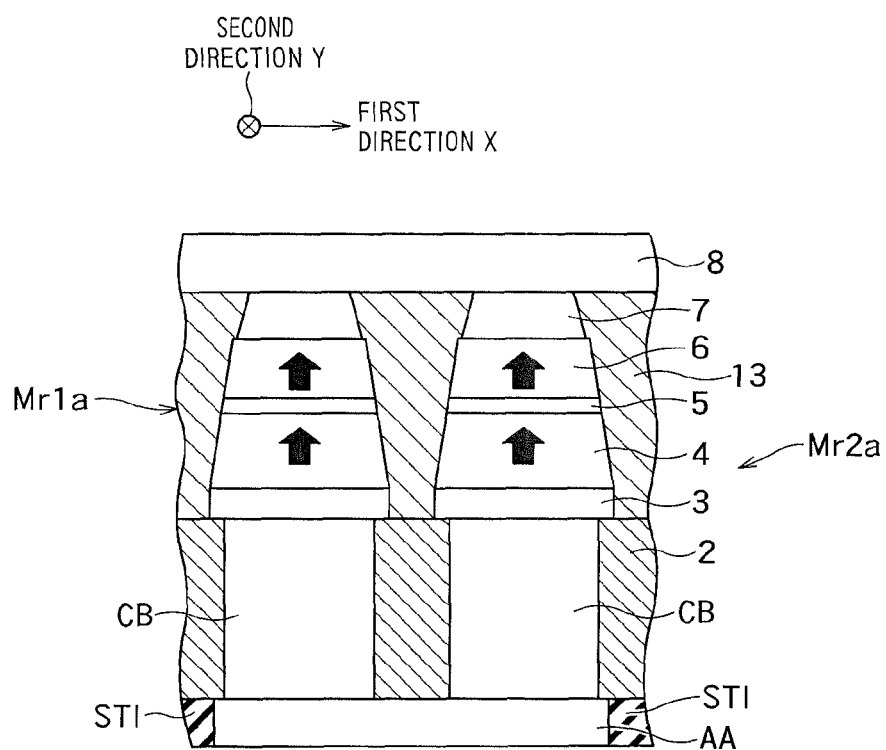
FIG. 21 is a cross-sectional view showing an example of a cross section taken along the line B-B in FIG. 20.

FIG. 20 is a plan view showing an example of the layout of the resistive element region 100b of the semiconductor storage device 100 shown in FIG. 1 in which resisting MTJ elements are electrically connected in parallel with each other. FIG. 21 is a cross-sectional view showing an example of a cross section taken along the line B-B in FIG. 20. In FIGS. 20 and 21, the same reference symbols as those in FIGS. 2 and 3 denote the same components as in the first embodiment.

As shown in FIGS. 20 and 21, for example, the first and second resisting MTJ elements "Mr1a" and "Mr2a" adjacent to each other in the first direction "X" of the plurality of resisting MTJ elements are electrically connected to each other by the active area "AA", which is electrically connected to the lower electrodes 3, and are further electrically connected to each other by the upper electrode 8.

In this embodiment, the first ferromagnetic layer 4 of the first resisting MTJ element "Mr1a" and the first ferromagnetic layer 4 of the second resisting MTJ element "Mr2a" are electrically connected to each other by the active area "AA", and the second ferromagnetic layer 6 of the first resisting MTJ element "Mr1a" and the second ferromagnetic layer 6 of the second resisting MTJ element "Mr2a" are electrically connected to each other by the upper electrode 8.

That is, the first and second resisting MTJ elements "Mr1a" and "Mr2a" are electrically connected in parallel with each other between the upper electrode 8 and the active area "AA".

Adjacent bit line contact wires "CB" are insulated from each other by the interlayer insulating films 2. Furthermore, the bit line contact wires "CB" are electrically connected to the active areas "AA" formed on the semiconductor substrate 1. In addition, STI or the like is formed in the semiconductor substrate 1 to insulate adjacent active areas "AA".

In this case, if the bit line contact wire "CB" or the active area "AA" has a significant resistance, the resistance needs to be taken into consideration in design of the resistance of the resistive element.

Figure 22:
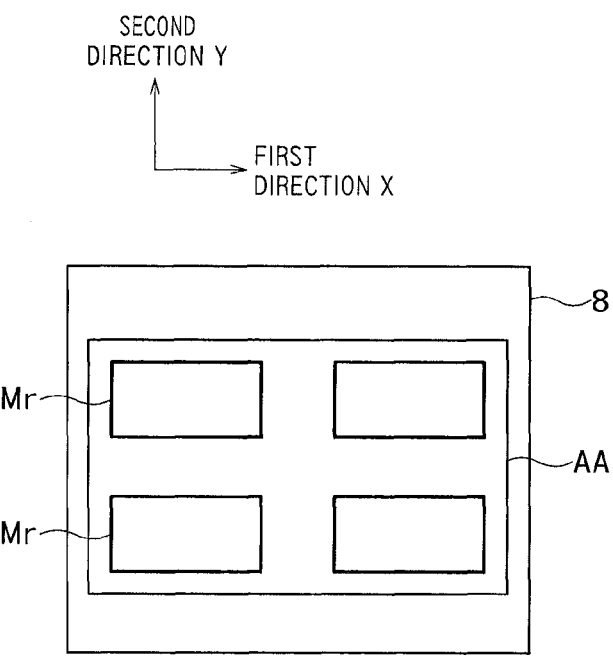
FIG. 22 is a plan view showing the other example of the layout of the resistive element region 100b of the semiconductor storage device 100 shown in FIG. 1 in which resisting MTJ elements are electrically connected in parallel with each other.
Figure 23:
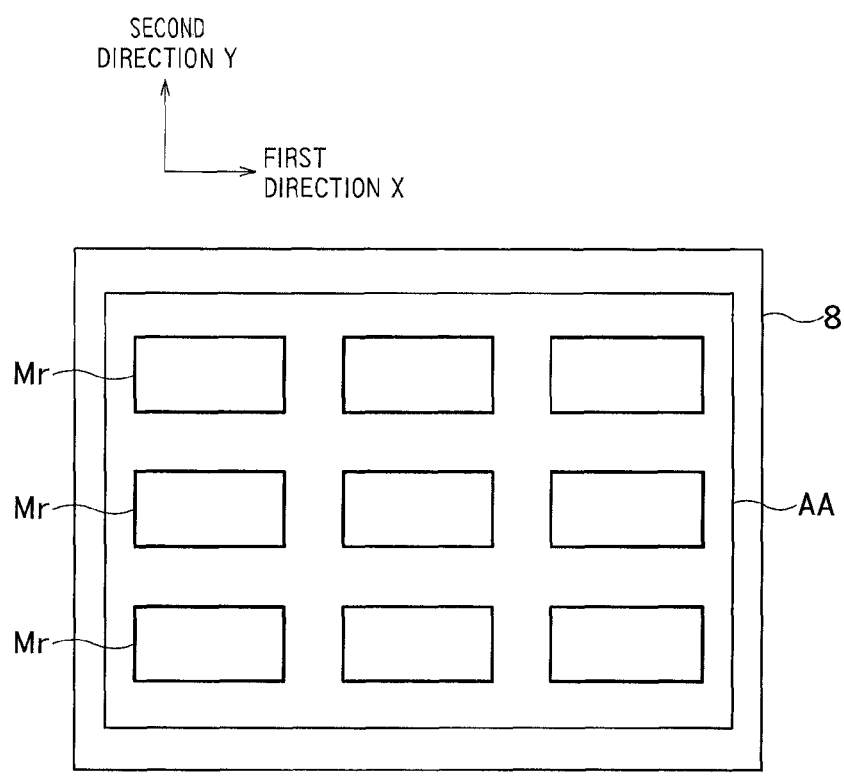
FIG. 23 is a plan view showing the other example of the layout of the resistive element region 100b of the semiconductor storage device 100 shown in FIG. 1 in which resisting MTJ elements are electrically connected in parallel with each other.

FIGS. 22 and 23 are plan views showing other examples of the layout of the resistive element region 100b of the semiconductor storage device 100 shown in FIG. 1 in which resisting MTJ elements are electrically connected in parallel with each other.

As shown in FIGS. 22 and 23, more resisting MTJ elements "Mr" than those in the example shown in FIG. 20 can be electrically connected in parallel with each other. In those cases, the resistance of the resistive element can be designed to be lower.

As described above, the resistance of the resistive element can be designed to be lower by forming the resistive element by electrically connecting a plurality of resisting MTJ element "Mr" in parallel with each other between the upper electrode 8 and active area "AA".

As described above, in the semiconductor storage device according to the fifth embodiment, the MTJ elements connected in series with each other can serve as resistive bodies having desired characteristics, and the increase of the manufacturing cost can be reduced.

Sixth Embodiment

In a sixth embodiment, an example of a configuration designed for reducing the resistance of the resisting MTJ element will be described.

Figure 24:
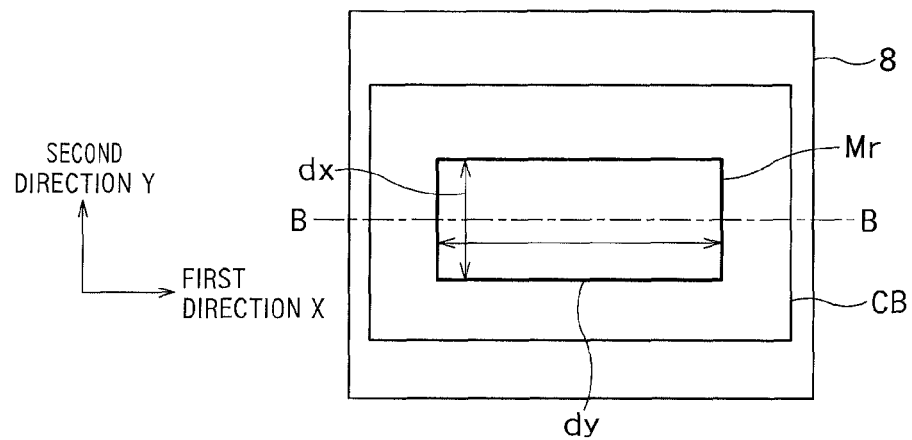
FIG. 24 is a plan view showing an example of the layout of the resistive element region 100b of the semiconductor storage device 100 shown in FIG. 1.
Figure 25:
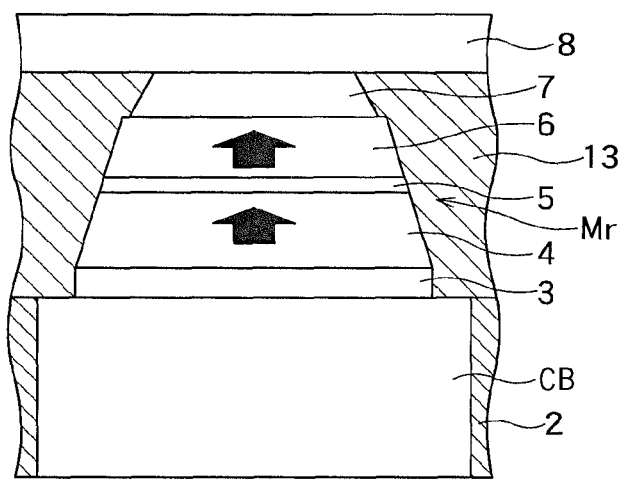
FIG. 25 is a cross-sectional view showing an example of a cross section taken along the line B-B in FIG. 24.

FIG. 24 is a plan view showing an example of the layout of the resistive element region 100b of the semiconductor storage device 100 shown in FIG. 1. FIG. 25 is a cross-sectional view showing an example of a cross section taken along the line B-B in FIG. 24. In FIGS. 24 and 25, the same reference symbols as those in FIGS. 2 and 3 denote the same components as in the first embodiment. In FIGS. 24 and 25, for the sake of simplicity, illustration of the wiring, the contacts, the interlayer insulating film, the semiconductor substrate and the like is omitted.

As shown in FIGS. 24 and 25, the length "dx" of the side of the first cross section of the resisting MTJ element "Mr" in the first direction "X" is set to be longer than the length "du" (which corresponds to the minimum working size "F", for example) of the side of the second cross section in the first direction "X". In addition, the length "dy" of the side of the first cross section in the second direction "Y" can be set to be longer than the length "du" (which corresponds to the minimum working size "F", for example) of the side of the second cross section in the second direction "Y".

In this way, the resistance of the resistive element can be designed to be lower.

The remainder of the configuration of the semiconductor storage device 100 is the same as that in the first embodiment.

As described above, in the semiconductor storage device according to the sixth embodiment, the MTJ elements connected in series with each other can serve as resistive bodies having desired characteristics, and the increase of the manufacturing cost can be reduced.

Seventh Embodiment

In a seventh embodiment, another example of the configuration in which adjacent resisting MTJ elements are electrically connected in parallel with each other will be described.

Figure 26:
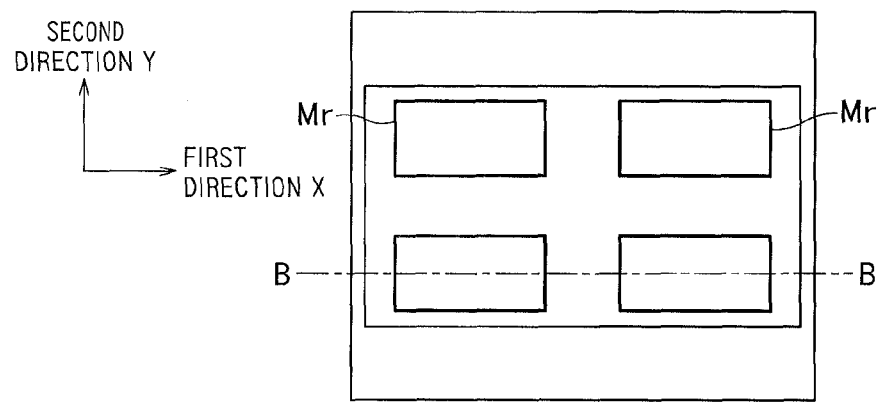
FIG. 26 is a plan view showing another example of the layout of the resistive element region 100b of the semiconductor storage device 100 shown in FIG. 1 in which resisting MTJ elements are electrically connected in parallel with each other.
Figure 27:
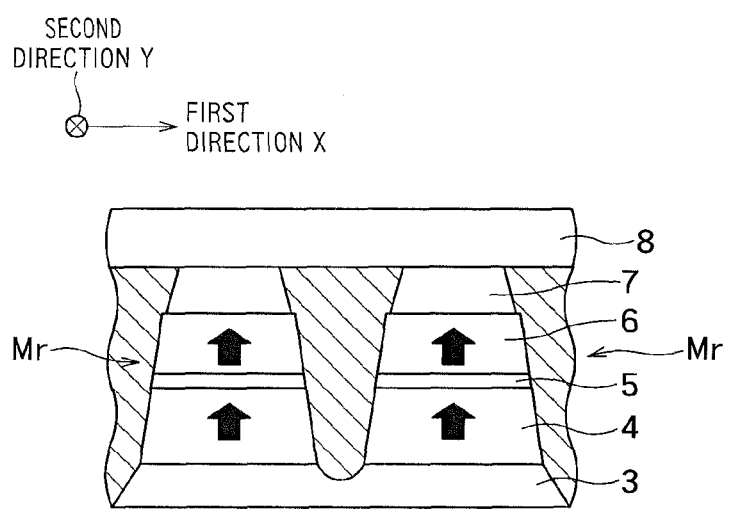
FIG. 27 is a cross-sectional view showing an example of a cross section taken along the line B-B in FIG. 26.

FIG. 26 is a plan view showing another example of the layout of the resistive element region 100b of the semiconductor storage device 100 shown in FIG. 1 in which resisting MTJ elements are electrically connected in parallel with each other. FIG. 27 is a cross-sectional view showing an example of a cross section taken along the line B-B in FIG. 26. In FIGS. 26 and 27, the same reference symbols as those in FIGS. 2 and 3 denote the same components as in the first embodiment. In FIGS. 26 and 27, for the sake of simplicity, illustration of the interlayer insulating film, the semiconductor substrate and the like is omitted.

As shown in FIGS. 26 and 27, for example, the first and second resisting MTJ elements "Mr1a" and "Mr2a" adjacent to each other in the first direction "X" of the plurality of resisting MTJ elements are electrically connected to each other by the lower electrode 3 and are further electrically connected to each other by the upper electrode 8.

In this embodiment, the first ferromagnetic layer 4 of the first resisting MTJ element "Mr1a" and the first ferromagnetic layer 4 of the second resisting MTJ element "Mr2a" are electrically connected to each other by the lower electrode 3, and the second ferromagnetic layer 6 of the first resisting MTJ element "Mr1a" and the second ferromagnetic layer 6 of the second resisting MTJ element "Mr2a" are electrically connected to each other by the upper electrode 8.

That is, the first and second resisting MTJ elements "Mr1a" and "Mr2a" are electrically connected in parallel with each other between the upper electrode 8 and the lower electrode 3.

As in the first embodiment, in order that the lower electrode 3 is not completely etched by IBE, for example, the distances "d" between adjacent resisting MTJ elements "Mr" in the first direction "X" and the second direction "Y" are set to be shorter than the length "du" (which corresponds to the minimum working size "F", for example) of the side of the second cross section in the first direction "X".

In this way, the resisting MTJ elements "Mr" are electrically connected to the common lower electrodes 3.

Figure 28:
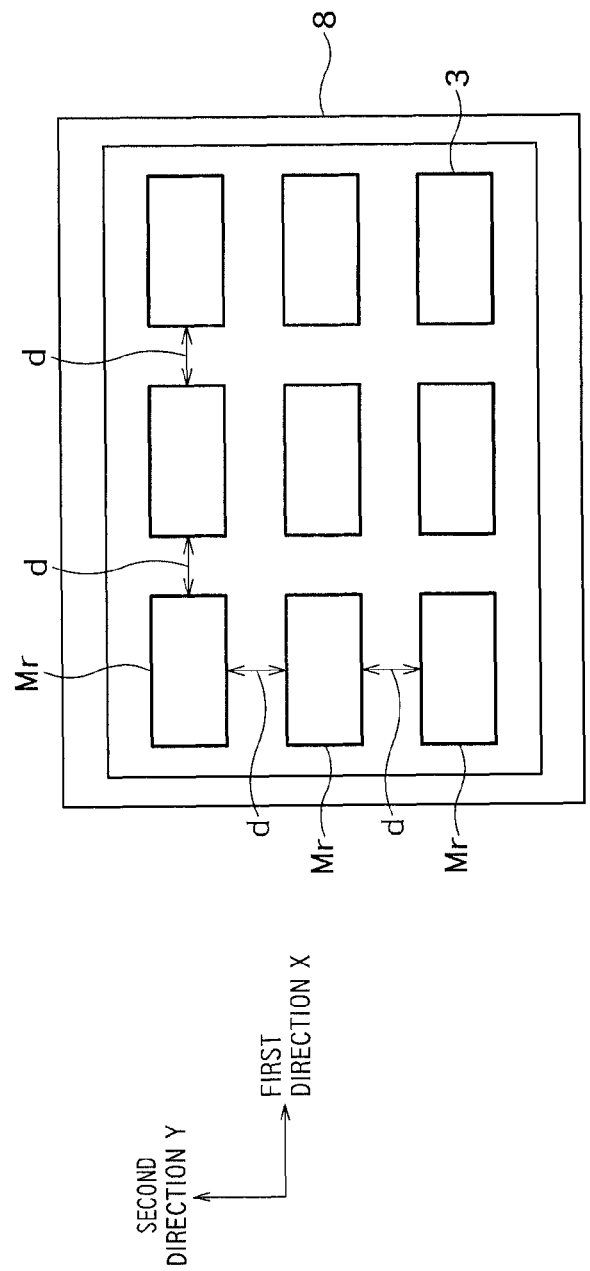
FIG. 28 is a plan view showing another example of the layout of the resistive element region 100b of the semiconductor storage device 100 shown in FIG. 1 in which resisting MTJ elements are electrically connected in parallel with each other.

FIG. 28 is a plan view showing another example of the layout of the resistive element region 100b of the semiconductor storage device 100 shown in FIG. 1 in which resisting MTJ elements are electrically connected in parallel with each other.

As shown in FIG. 28, more resisting MTJ elements "Mr" than those in the example shown in FIG. 26 can be electrically connected in parallel with each other. In those cases, the resistance of the resistive element can be designed to be lower.

As described above, the resistance of the resistive element can be designed to be lower by forming the resistive element by electrically connecting a plurality of resisting MTJ element "Mr" in parallel with each other between the upper electrode 8 and the lower electrode 3.

The remainder of the configuration of the semiconductor storage device 100 is the same as that in the first embodiment.

As described above, in the semiconductor storage device according to the seventh embodiment, the MTJ elements connected in series with each other can serve as resistive bodies having desired characteristics, and the increase of the manufacturing cost can be reduced.

As described above with regard to the embodiments, owing to the circuit design, the resisting MTJ element "Mr" can be designed to have an irregular pattern or an arbitrary resistance.

The embodiments are given for the purpose of illustration, and the scope of the present invention is not limited to the embodiments.

The invention claimed is:

1. A semiconductor storage device, comprising:
a memory cell array region in which a plurality of storing MTJ elements capable of changing resistance depending on a direction of magnetization are arranged on a semiconductor substrate; and
a resistive element region in which a plurality of resisting MTJ elements are arranged on the semiconductor substrate along a first direction and a second direction perpendicular to the first direction,
wherein an area of a first cross section of the resisting MTJ element, the first cross section parallel with an upper surface of the semiconductor substrate, is sufficiently larger than an area of a second cross section of the storing MTJ element, the second cross section also parallel with the upper surface of the semiconductor substrate, to prevent flux reversal of the resisting MTJ element, the storing MTJ element and the resisting MTJ element each comprises a free layer whose direction of magnetization is inverted by a spin transfer torque, and the second direction is perpendicular to the first direction in an upper surface of the semiconductor substrate.

2. The semiconductor storage device according to claim 1, wherein of the plurality of resisting MTJ elements, a first resisting MTJ element and a second resisting MTJ element adjacent to each other in the first direction are electrically connected in series with each other.

3. The semiconductor storage device according to claim 2, wherein the first and second resisting MTJ elements are electrically connected in series with each other by any of a lower electrode, a bit line contact wire electrically connected to the lower electrode, or an active area formed on the semiconductor substrate and electrically connected to the bit line contact wire.

4. The semiconductor storage device according to claim 2, wherein the second resisting MTJ element and a third resisting MTJ element adjacent to the second resisting MTJ element in the first or second direction are electrically connected to each other by an upper electrode.

5. The semiconductor storage device according to claim 2, wherein a first distance between the first resisting MTJ element and the second resisting MTJ element is shorter than a reference distance between adjacent two of the plurality of storing MTJ elements.

6. The semiconductor storage device according to claim 5, wherein the first distance is shorter than a second distance between the second MTJ element and the third resisting MTJ element.

7. The semiconductor storage device according to claim 1, wherein a first resisting MTJ element and a second resisting MTJ element adjacent to each other in the first direction of the plurality of resisting MTJ elements are electrically connected in parallel with each other.

8. The semiconductor storage device according to claim 7, wherein the first resisting MTJ element and the second resisting MTJ element are electrically connected to each other by any of an active area formed on the semiconductor substrate, a bit line contact wire formed on the active area, or a lower electrode connected to the bit line contact wire.

9. The semiconductor storage device according to claim 7, wherein the first resisting MTJ element and the second resisting MTJ element are electrically connected to each other by the upper electrode.

10. The semiconductor storage device according to claim 2, wherein the first cross section of the plurality of resisting MTJ elements and the second cross section of the plurality of storing MTJ elements have a substantially rectangular shape, and a side of the first cross section in the first direction is longer than a side of the second cross section.

* * * * *